(12) United States Patent
Horiuchi et al.

(10) Patent No.: US 7,149,496 B2
(45) Date of Patent: Dec. 12, 2006

(54) HIGH-FREQUENCY MODULE AND RADIO COMMUNICATION APPARATUS

(75) Inventors: Masafumi Horiuchi, Kokubu (JP); Katsuro Nakamata, Kokubu (JP); Hiroshi Ninomiya, Kokubu (JP); Yasuhiko Fukuoka, Kokubu (JP); Satoru Iwasaki, Kokubu (JP); Kenta Fukuyama, Kokubu (JP)

(73) Assignee: Kyocera Corporation, Kyoto (JP)

( * ) Notice: Subject to any disclaimer, the term of this patent is extended or adjusted under 35 U.S.C. 154(b) by 438 days.

(21) Appl. No.: 10/810,492

(22) Filed: Mar. 26, 2004

(65) Prior Publication Data

US 2004/0203552 A1 Oct. 14, 2004

(30) Foreign Application Priority Data

| Mar. 27, 2003 | (JP) | ............................. 2003-087255 |
| Mar. 27, 2003 | (JP) | ............................. 2003-087256 |
| Mar. 27, 2003 | (JP) | ............................. 2003-087257 |
| Jan. 28, 2004 | (JP) | ............................. 2004-019478 |

(51) Int. Cl.
*H04B 1/28* (2006.01)
*H04M 1/00* (2006.01)

(52) U.S. Cl. .................................. 455/333; 455/552.1

(58) Field of Classification Search ................ 455/333, 455/73, 552.1, 550.1, 269, 323; 330/250; 333/116, 247; 257/712, 748, 724, 659; 438/460
See application file for complete search history.

(56) References Cited

U.S. PATENT DOCUMENTS 6,683,512 B1 * 1/2004 Nakamata et al. .......... 333/126

| 6,919,762 | B1 * | 7/2005 | Akamine et al. ........... 330/133 |
| 2002/0055349 | A1 * | 5/2002 | Ammar ...................... 455/342 |
| 2002/0196085 | A1 * | 12/2002 | Nakamata et al. .......... 330/302 |
| 2003/0090882 | A1 * | 5/2003 | Song .......................... 361/761 |
| 2004/0127182 | A1 * | 7/2004 | Hayashi ................... 455/193.1 |
| 2004/0224643 | A1 * | 11/2004 | Nakai ........................... 455/78 |
| 2004/0240420 | A1 * | 12/2004 | Nakai .......................... 370/342 |
| 2005/0037804 | A1 * | 2/2005 | Yajima et al. ............ 455/552.1 |
| 2005/0245212 | A1 * | 11/2005 | Ono et al. ................ 455/127.1 |
| 2006/0094393 | A1 * | 5/2006 | Okuyama et al. ........... 455/333 |
| 2006/0135103 | A1 * | 6/2006 | Ammar .................... 455/232.1 |

FOREIGN PATENT DOCUMENTS

| JP | 06-334449 | 12/1994 |
| JP | 09-238033 | 9/1997 |
| JP | 11-225088 | 8/1999 |
| JP | 2002-171196 | 6/2002 |
| JP | 2002-232320 | 8/2002 |
| JP | 2002-290257 | 10/2002 |

* cited by examiner

*Primary Examiner*—Sonny Trinh
(74) *Attorney, Agent, or Firm*—Hogan & Hartson LLP

(57) ABSTRACT

A high-frequency module comprises: a diplexer connected to an antenna terminal for branching a plurality of transmission/reception systems different in pass band from one another; switch circuits for switching the transmission/reception systems to transmission systems and reception systems; power amplifiers for amplifying transmission signals in the pass bands of the transmission systems; and matching circuits for matching the impedances of the power amplifiers to one another. The power amplifiers and the switch circuits are respectively formed by high-frequency semiconductor integrated circuit elements, and these high-frequency semiconductor integrated circuit elements are mounted on the surface of the multi-layer substrate. The high-frequency module is reduced both in size and loss and increased in isolation in its entirety.

35 Claims, 16 Drawing Sheets

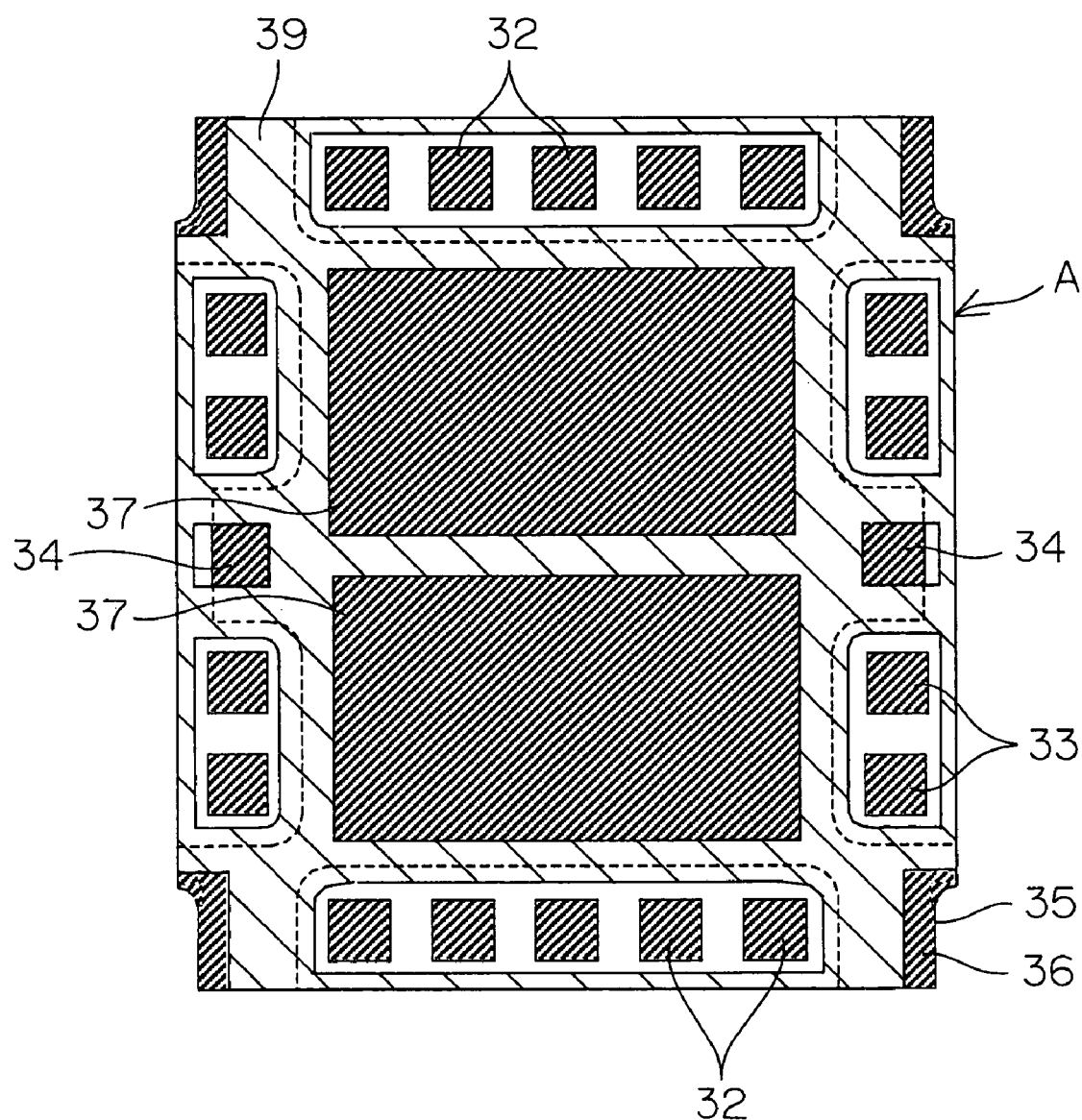

HIGH-FREQUENCY MODULE AND RADIO COMMUNICATION APPARATUS

This application is based on application Nos. 2003-87257, 2003-87255 and 2003-87256 filed with the Japanese Patent Office, and application No. 2004-019478 filed with the Japanese Patent Office, the contents of which are incorporated hereinto by reference.

BACKGROUND OF THE INVENTION

1. Field of the Invention

The present invention relates to a high-frequency module and a radio communication apparatus. More particularly, the present invention relates to a high-frequency module which is suitable for a multi-band mobile radio terminal and on which there are mounted power amplifiers, switch circuits, a diplexer, directional couplers, an auto power controller and the like, and also to a radio communication apparatus having such a high-frequency module mounted thereon.

2. Description of Related Art

Recently, there is proposed a cellular phone of the multi-band type in which two or more transmission/reception systems are mounted in a single cellular phone.

Such a multi-band type cellular phone is expected as a highly convenient device because transmission/reception can be made by selecting the transmission/reception system suitable to the regional characteristics, intended purpose and the like. For example, there are now widespread dual-band cellular phones on which two systems of the GSM (Global System for Mobile Communications)/DCS (Digital Cellular System) are mounted.

FIG. 16 is a block diagram of a high-frequency circuit unit of a dual-band cellular phone of the GSM/DCS systems.

The high-frequency circuit unit has a high-frequency switch module ASM1 arranged to branch the two transmission/reception systems GSM/DCS different in pass band from each other, and to switch the transmission system TX and the reception system RX in each transmission/reception system DCS, GSM. The high-frequency switch module ASM1 comprises low-pass filters, switch circuits and a diplexer, and is further provided with the transmission system DCS TX and the reception system DCS RX of the transmission/reception system DCS, and the transmission system GSM TX and the reception system GSM RX of the transmission/reception system GSM.

The transmission systems DCS TX, GSM TX respectively have directional couplers COP100, 200, and power amplifiers AMP100, 200. Each of the power amplifiers AMP100, 200 is formed by a power high-frequency amplifying element MMIC and a matching circuit.

At the transmission time, a transmission signal amplified by the power amplifier AMP100 or AMP200, is transmitted, as a high-frequency signal, from an antenna ANT through the directional coupler COP100 or COP200 and the high-frequency switch module ASM1.

On the other hand, the reception systems DCS RX, GSM RX respectively have band-pass filters BPF300, BPF400 and low-noise amplifiers AMP300, AMP400. At the reception time, a high-frequency signal received at the antenna ANT is taken out through the high-frequency switch module ASM1, and then amplified by the RX-side low-noise amplifier AMP300 or AMP400 after an unnecessary signal in the vicinity of the reception band has been removed by the band-pass filter BPF300 or BPF400.

In a cellular phone of the dual-band type, it is required to mount circuits necessary for both transmission/reception systems. When the circuits are formed by using individually dedicated components, this disadvantageously increases the device size and costs.

It is therefore required to advantageously develop an approach for smaller and more economical devices by standardizing circuit components as much as possible.

It is further required to improve the power added efficiency of the power amplifiers which consume the greater part of the power of a cellular phone.

In a cellular phone of the multi-band type, however, the component elements of the high-frequency switch module, the power amplifiers, the matching circuits, and the directional couplers are mounted on a printed circuit board, so that a further miniaturization cannot be expected.

On the other hand, a high-frequency amplifier circuit to be mounted on a conventional high-frequency module is generally a multi-stage amplifier in which a plurality of high-frequency amplifying elements are connected in series. A voltage-supply bias line is connected to each high-frequency amplifying element, to which a direct-current voltage is supplied. Provision is made such that this voltage-supply bias line serves as a stub having a ¼ wavelength with respect to a high frequency signal. This prevents the high-frequency signal from entering into the direct-current voltage source.

Further, the electric characteristics of the multi-stage high-frequency amplifying elements are adjusted such that the output power, the harmonic component and the like satisfy the standards by an output matching circuit connected at the last stage.

As is often the case with a multi-stage amplifying circuit in which a plurality of high-frequency amplifying elements are connected in series, there is a problem with the relationship between the output power and the output control voltage in a conventional high-frequency module. That is, the waveform is distorted at the point where the operation of a high-frequency amplifying element is switched to the next stage. Accordingly, the relationship between the output power and the output control voltage does not disadvantageously linearly change as shown in FIG. 15.

Therefore, when such a conventional high-frequency module is mounted on a cellular phone at its terminal and the output power is intended to be controlled, it takes much time to obtain the desired power. In the worst case, there is a possibility that two or more output control voltage values exist for obtaining the desired power, so that the output power cannot be controlled.

To improve the above problem, it is required to change the designing of the gain and the like of the high-frequency amplifying elements at each stage of each power amplifier. Thus, much time and cost are required for obtaining the effects of the improvement in characteristics.

BRIEF SUMMARY OF THE INVENTION

It is an advantage of the present invention to provide a high-frequency module reduced both in size and loss and increased in isolation in its entirety, by integrating the circuit elements which form the circuits from a diplexer for branching a plurality of transmission/reception systems different in pass band into individual transmission/reception systems, up to power amplifiers.

It is another advantage of the present invention to provide a high-frequency module in which the output power changes linearly with respect to the output control voltage without any change in the designing of the high-frequency power amplifiers.

It is a further advantage of the present invention to provide a small and high-performance radio communication apparatus on which the high-frequency module above-mentioned is mounted.

A high-frequency module according to the present invention comprises: a diplexer mounted on the surface or inside of a multi-layer substrate comprising a plurality of laminated dielectric layers, and connected to an antenna terminal for branching a plurality of transmission/reception systems different in pass band from one another; switch circuits for switching the transmission/reception systems to transmission systems and reception systems; power amplifiers for amplifying transmission signals in the pass bands of the transmission systems; and matching circuits for matching the impedances of the power amplifiers to one another, the power amplifiers and the switch circuits respectively forming high-frequency semiconductor integrated circuit elements, and these high-frequency semiconductor integrated circuit elements being mounted on the surface of the multi-layer substrate.

According to the high-frequency module having the arrangement above-mentioned, the circuit elements forming the circuits from the diplexer to the power amplifiers, can be miniaturized in a unitary structure, and the component elements can simultaneously be designed. It is therefore possible to make an optimum characteristic adjustment as a module. It is therefore not required to dispose characteristic adjusting circuits among the component elements. This not only reduces the loss, but also reduces the costs because the process for designing portable radio terminals can be shortened.

Further, the switch circuits and the power amplifiers are respectively formed by high-frequency semiconductor integrated circuit elements, and mounted on the surface of the multi-layer substrate. This produces the following effects.

In prior art, a plurality of diodes, inductor elements and capacitor elements forming switch circuits are mounted on the top of a multi-layer substrate, or incorporated therein. On the other hand, according to the present invention, the switch circuits and the power amplifiers are respectively formed by the high-frequency semiconductor integrated circuit elements, and mounted on the top of the multi-layer substrate. This advantageously reduces the switch circuits in size.

Further, other circuit elements than the switch circuits can be incorporated under the surface of the multi-layer substrate on which there are mounted the high-frequency semiconductor integrated circuit elements forming the switch circuits. This also advantageously miniaturizes the module in its entirety.

Further, the number of component elements forming the switch circuits is reduced, thus contributing to reduction in production process. The miniaturization and the reduction in production process lower the production cost.

Further, prior-art switch circuits require a bias current in the order of 10 mA for turning the diodes to ON/OFF. On the other hand, according to the present invention, the switch circuit using a high-frequency semiconductor integrated circuit element, requires only a current in the order of 0.5 mA for the ON/OFF purpose. This advantageously lowers the power consumption.

Further, the function of branching a plurality of transmission/reception systems different in pass band from one another, is not given to the switch circuits formed by the high-frequency semiconductor integrated circuit elements, but is given to the diplexer disposed between the antenna terminal and the switch circuits. Accordingly, a transient high-voltage surge which entered the antenna terminal, does not directly reach the switch circuits formed by the high-frequency semiconductor integrated circuit elements. Provision can be made such that a high-voltage surge indirectly reaches the switch circuits after attenuation by the attenuating function of the diplexer or filters disposed before and after the diplexer. This improves the reliability of the switch circuits and consequently the reliability of the high-frequency module.

The high-frequency module of the present invention further comprises: directional couplers disposed between the switch circuits and the power amplifiers for taking out monitor signals from transmission signals of the transmission systems; and an automatic power control circuit for converting, into control signals, the monitor signals taken out from directional couplers and for supplying the control signals thus converted, to the power amplifiers.

In this case, when the automatic power control circuit is also mounted, as a high-frequency semiconductor integrated circuit element, on the surface of the multi-layer substrate, this further contributes to miniaturization.

The high-frequency module of the present invention may comprise a current detecting circuit for detecting the amounts of electric currents flowing in the power amplifiers, and an automatic power control circuit for controlling the powers of the power amplifiers based on the current amounts detected by the current detecting circuit.

When the current detecting circuit for detecting the amounts of electric currents flowing in the power amplifiers, is connected to the automatic power control circuit, this eliminates the necessity of the directional couplers for monitoring the output powers from the power amplifiers. This not only reduces the number of component elements, but also contributes to miniaturization.

Further, when the automatic power control circuit is mounted, as a high-frequency semiconductor integrated circuit element, on the surface of the multi-layer substrate, this contributes to miniaturization of the circuit.

Preferably, a low-pass filter for attenuating a harmonic component of a transmission signal is disposed at at least one position in the signal passages from the antenna terminal to the power amplifiers.

According to the high-frequency module having the arrangement above-mentioned, a harmonic component of a transmission signal in the pass band of each transmission system, can be attenuated. In particular, when low-pass filters are separately disposed at a plurality of positions, the low-pass filters and all or any one of the diplexer, the switch circuits, the directional couplers and the matching circuits, are brought into a relationship of conjugated matching in the frequency band to be attenuated. It is therefore possible to make adjustment for preventing the attenuation characteristics from getting worse.

Preferably, at least one low-pass filter is disposed in the signal passages from the antenna terminal to the switch circuits.

In the high-frequency module having the arrangement above-mentioned, a harmonic distortion component generated from the switch circuits can firstly be attenuated effectively in the passages from the switch circuits to the antenna terminal. Secondly, there are instances where the transmission systems and the reception systems are placed in close vicinity to each other inside of the high-frequency module and/or in an external circuit connected to the high-frequency module, such that isolation between the transmission systems and the reception systems is not sufficient. In such a case, a harmonic component passing through the passages from the transmission systems to the antenna terminal through the reception systems, can effectively be attenuated by the low-pass filter.

Preferably, a high-pass filter or a band-pass filter for attenuating a transient high-voltage surge which entered the antenna terminal is disposed in the passages from the antenna terminal to the switch circuits.

According to the arrangement above-mentioned, a transient high-voltage surge which entered the antenna terminal, can be attenuated by the high-pass filter or the band-pass filter. This improves the reliability of the high-frequency semiconductor integrated circuits lower in resistance to the high-voltage surge than passive components, and consequently improves the reliability of the high-frequency module with respect to the high-voltage resistance.

The high-pass filter or the band-pass filter may be disposed only in the passage of the transmission/reception system having the lowest frequency band.

The frequency of a transient high-voltage surge which entered the antenna terminal, is generally distributed in the range from 0 MHz to 300 MHz, and this is lower than the frequency bands of the transmission/reception systems which are covered by the present invention. Accordingly, in such a high-frequency module, the high-pass filter or the band-pass filter may be disposed only for a high-frequency semiconductor integrated circuit belonging to the transmission/reception system having the lowest frequency band which is regarded as having the largest breakdown probability. This improves the reliability of the elements with respect to breakdown. Thus, the reliability of the high-frequency module can be improved in its entirety with the increase in the number of elements minimized.

Preferably, a high-frequency module according to the present invention is arranged such that a die pad is formed on the surface of the multi-layer substrate, that the high-frequency semiconductor integrated circuit elements forming the power amplifiers are mounted on the surface of the multi-layer substrate through the die pad, and that the die pad is connected, through heat radiating via-hole conductors formed as passing through the multi-layer substrate, to a ground terminal pattern formed on the underside of the multi-layer substrate.

According to the high-frequency module having the arrangement above-mentioned, heat generated at the power amplifiers can be discharged to the outside of the module through the die pad, the heat radiating via-hole conductors and the ground terminal pattern on the underside of the multi-layer substrate. It is therefore possible to prevent reduction in output level, thermal runaway or the like when the power amplifiers are increased in temperature.

Preferably, a high-frequency module of the present invention is arranged such that another die pad is formed on the surface of the multi-layer substrate, that the high-frequency semiconductor integrated circuit elements forming the switch circuits, are mounted on the surface of the multi-layer substrate through the die pad, and that the die pad for the high-frequency semiconductor integrated circuit elements forming the power amplifiers, is not connected to the die pad for the high-frequency semiconductor integrated circuit elements forming the switch circuits by a conductor pattern formed on the surface or inside of the multi-layer substrate.

According to the high-frequency module having the arrangement above-mentioned, heat generated at the power amplifiers is not transmitted directly to the switch circuits. This prevents the switch circuits from being changed in characteristics or getting out of order due to temperature rise.

Preferably, distributed constant lines forming the matching circuits are formed between the portions where the directional couplers, the switch circuits or the diplexer are mounted, and the portions where the high-frequency semiconductor integrated circuit elements for the power amplifiers are mounted.

According to the high-frequency module having the arrangement above-mentioned, the flow of a high-frequency signal from the input terminal to the output terminal in the circuit, becomes a serial signal flow inside of the multi-layer substrate. This eliminates a waste by pass line, thus contributing to less loss and higher isolation among the elements. This maximizes the power addition efficiency (the ratio of output power to supply power) of the power amplifiers.

Preferably, a high-frequency module of the present invention is arranged such that an interference preventing pattern made of a conductor is formed on the surface or inside of the multi-layer substrate, and that this interference preventing pattern is connected to the ground terminal pattern on the underside of the multi-layer substrate.

The high-frequency module having the arrangement above-mentioned effectively prevents not only deterioration of the harmonic component attenuation effects of the filters, but also deterioration of a transmission loss due to interference of the elements incorporated in the multi-layer substrate.

Preferably, the interference preventing pattern is disposed between the power amplifiers and any one of the directional couplers, the switch circuits and the diplexer.

The high-frequency module having the arrangement above-mentioned effectively prevents electromagnetic waves of the power amplifiers from leaking to the switches and the like through the inside of the multi-layer substrate.

A high-frequency module of the present invention is characterized in that the relative dielectric constant of the dielectric layers forming the multi-layer substrate, is not less than 4, preferably 8 or more.

According to the high-frequency module having the arrangement above-mentioned, firstly, the wavelength of a signal to be transmitted is shortened in inverse proportion to the square root of the relative dielectric constant. Accordingly, the distributed constant lines forming the circuits can be shortened in length. Secondly, the capacitor opposite areas can be reduced in inverse proportion to the relative dielectric constant. In view of these two factors, the high-frequency module can be miniaturized.

A high-frequency module of the present invention is characterized in that each of the switch circuits comprises a semiconductor integrated circuit element having a circuit pattern on a substrate of which chief ingredient is a GaAs (gallium arsenide) compound.

According to the high-frequency module having the arrangement above-mentioned, the switches mounted on the surface of the multi-layer substrate can be reduced both in size and transit loss, thus contributing to miniaturization and less loss of the high-frequency module in its entirety.

A high-frequency module of the present invention is characterized in that each of the conductor layers forming the multi-layer substrate, is a conductor of which chief ingredient is Ag (silver), Cu (copper) or Au (gold).

According to the high-frequency module having the arrangement above-mentioned, the electric resistivity of the conductor pattern is small. This minimizes the transmission loss and reduces the resistance in the bias lines for supplying power to each of the power amplifiers. Thus, the power addition efficiency of the high-frequency module can be maximized.

In a high-frequency module of the present invention, the multi-layer substrate incorporates (i) a plurality of voltage supply bias lines for supplying voltages to a plurality of high-frequency amplifying elements, and (ii) an interference preventing ground pattern, the voltage supply bias lines are so disposed as not to overlap one another in plan elevation, and slits are formed in the interference preventing ground pattern for separating the same into at least two regions in each of which a voltage supply bias line is being formed.

Division grooves may be formed in the interference preventing ground pattern for separating the same into at least two regions in each of which a voltage supply bias line is being formed.

According to the arrangement above-mentioned, the slits or division grooves are formed in the interference preventing pattern at positions for dividing the same into a plurality of regions in each of which a voltage supply bias line is being formed. Thus, there are formed a plurality of interference preventing pattern portions divided in the same plane. A harmonic signal propagating in the interference preventing pattern can be blocked by these slits or division grooves. This prevents feedback of a harmonic signal in each power amplifier from the last-stage high-frequency amplifying element to the first-stage high-frequency amplifying element. This ultimately lowers the level of the harmonic signal at the output terminal of the high-frequency module.

In a high-frequency module of the present invention, the multi-layer substrate is provided on the underside thereof with a ground terminal pattern, a bias terminal pattern and a signal terminal pattern for connecting the high-frequency module to an external circuit, and the ground terminal pattern is disposed at the center of the underside of the multi-layer substrate.

According to the high-frequency module having the arrangement above-mentioned, it is firstly possible to minimize, in a perspective view in the lamination direction of the multi-layer substrate, the ratio of the element area on which the elements are mounted in the multi-layer substrate, to the substrate area which is required for mounting the multi-layer substrate on an external substrate. This improves the density of circuit elements at a maximum. Secondly, the ground terminal pattern is formed at the center of the underside of the multi-layer substrate. This not only stabilizes the grounds of the elements incorporated in the multi-layer substrate, but also improves the heat radiation characteristics of the high-frequency module. This prevents the power addition efficiency or the output powers of the power amplifiers from being lowered due to temperature rise.

There may be adopted an arrangement in which a plurality of terminal patterns for signal terminal patterns, bias supply terminal patterns and/or ground terminal patterns, are disposed, in a plurality of peripheral rows, around the ground terminal pattern disposed at the center of the underside of the multi-layer substrate.

According to the arrangement above-mentioned, a plurality of terminal pattern peripheral rows are disposed around the ground terminal pattern disposed at the center. It is therefore possible to respond to the increase in the number of terminals.

When the terminal patterns at the outermost peripheral row out of the terminal patterns around the ground terminal pattern disposed at the center of the underside of the multi-layer substrate, are allocated to ground terminal patterns, it is possible to prevent an interference signal from an external circuit, from entering into a signal terminal or a bias supply terminal.

A signal terminal pattern and/or a bias supply terminal pattern may be formed inside of the ground terminal pattern disposed at the center of the underside of the multi-layer substrate. In this case, it is possible to prevent an interference signal from an external circuit, from entering into a signal terminal or a bias supply terminal.

All or some of the signal terminal patterns, the ground terminal pattern or the bias terminal patterns on the underside of the multi-layer substrate, may be partly exposed, and the region which is not exposed may be coated with an overcoat glass.

According to the high-frequency module having the arrangement above-mentioned, there can be reduced the probability of a failure of short-circuit in the high-frequency module when the multi-layer substrate is mounted on an external substrate with the terminals on the underside of the multi-layer substrate connected to the external substrate by soldering.

In a high-frequency module of the present invention, voltage supply bias lines are connected to the high-frequency amplifying elements forming the power amplifiers, capacitors are connected to the voltage supply bias lines, and inductors are connected between the capacitors and the grounds.

According to the arrangement above-mentioned, the capacitors are connected between the voltage supply bias lines and the grounds. Thus, control is made such that a high-frequency signal from a high-frequency amplifying element does not flow in a direct-current voltage supply terminal. Further, by the inductors connected between the capacitors and the grounds, adjustment is made such that the high-frequency amplifying elements connected in a cascade manner, are connected at suitable impedance to one another. Accordingly, improvements can be made such that the output power characteristics change linearly with respect to the output control voltage without any change in the designing of the high-frequency amplifying elements. More specifically, the high-frequency module substrate on which the high-frequency amplifying elements are mounted, can be provided with a characteristic adjusting function.

The inductors connected to the capacitors may be connected to ground conductors through via-hole conductors formed in the dielectric layers, and may also be connected to ground conductors through via-hole conductors formed in the dielectric layers and conductor patterns formed in the dielectric layers. This achieves the desired characteristics without increase in the number of component elements of the high-frequency module.

At least a portion of the voltage supply bias lines may be formed on the surface of the dielectric multi-layer substrate, and the capacitors connected to the voltage supply bias lines may be mounted on the surface of the dielectric multi-layer substrate. When the capacitors are formed as surface mounting component elements, the impedance can readily be adjusted by adjusting the capacitors in capacity and the like.

The capacitors may be formed by opposite electrodes which sandwich dielectric layers of the multi-layer substrate therebetween. This not only reduces the number of component elements, but also increases the circuit density, and also achieves the miniaturization.

In a high-frequency module of the present invention, voltage supply bias lines are connected to the high-frequency amplifying elements, and low-capacity capacitors are connected to the voltage supply bias lines.

According to the arrangement above-mentioned, the low-capacity capacitors are connected between the grounds and the voltage supply bias lines connected to the high-frequency amplifying elements. This contributes to linearization of waveforms.

Preferably, the capacitors have capacity of not greater than 100 pF.

Generally, capacitors of not less than 1000 pF can be disposed between the voltage supply bias lines and the grounds, thereby to resonate the capacitors and the bias lines to prevent high-frequency signals from high-frequency amplifying elements, from flowing into direct-current voltage supply terminals.

However, when the capacitors have such large capacity, the resonance of the voltage supply bias lines causes the same to be open in the high-frequency region when viewed from the high-frequency amplifying elements. This substantially means that the circuits are not connected, and the impedances of the high-frequency amplifying elements cannot be adjusted.

Accordingly, when the capacity of the capacitors are set to low capacity of not greater than 100 pF, the resonance conditions are set such that the voltage supply bias lines are not open. This enables the high-frequency amplifying elements to be adjusted in impedance. As a result, waveform distortion can be adjusted to linearize the relationship between the output power characteristics and the output control voltage.

When the capacitors are disposed as component elements mounted on the surface of the dielectric multi-layer substrate, the impedance can readily be adjusted by adjusting the capacity or the like of the capacitors.

The capacitors may be formed by opposite electrodes which sandwich dielectric layers of the multi-layer substrate therebetween. This reduces the number of component elements and improves the circuit density, and also achieves the miniaturization.

The high-frequency module discussed in the foregoing, can suitably be mounted on a small radio communication apparatus such as a cellular phone.

BRIEF DESCRIPTION OF THE DRAWINGS

FIG. 9 is a view illustrating terminal patterns on the underside of a high-frequency module of the present invention;

Figure 11:
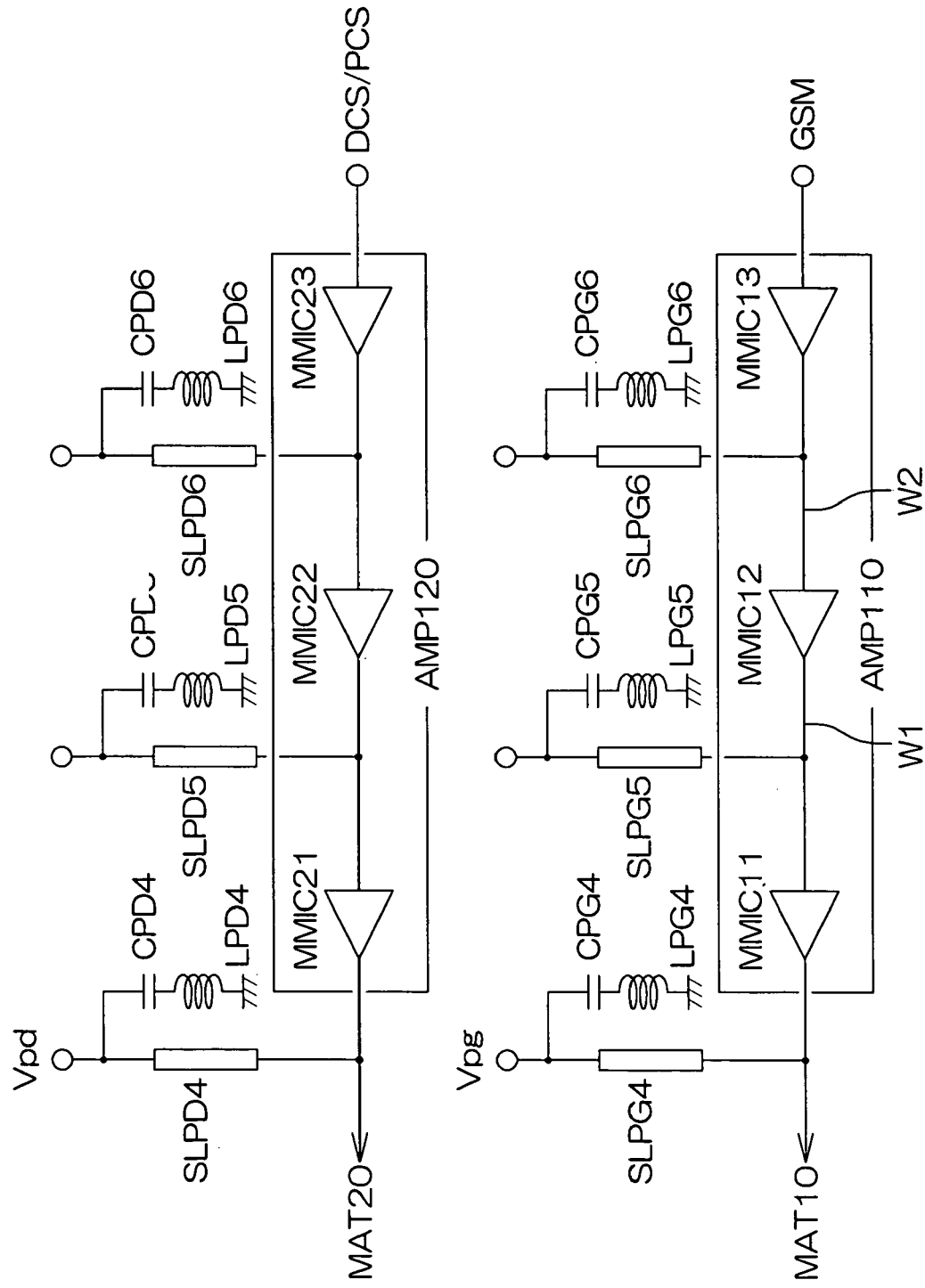
Figure 12:
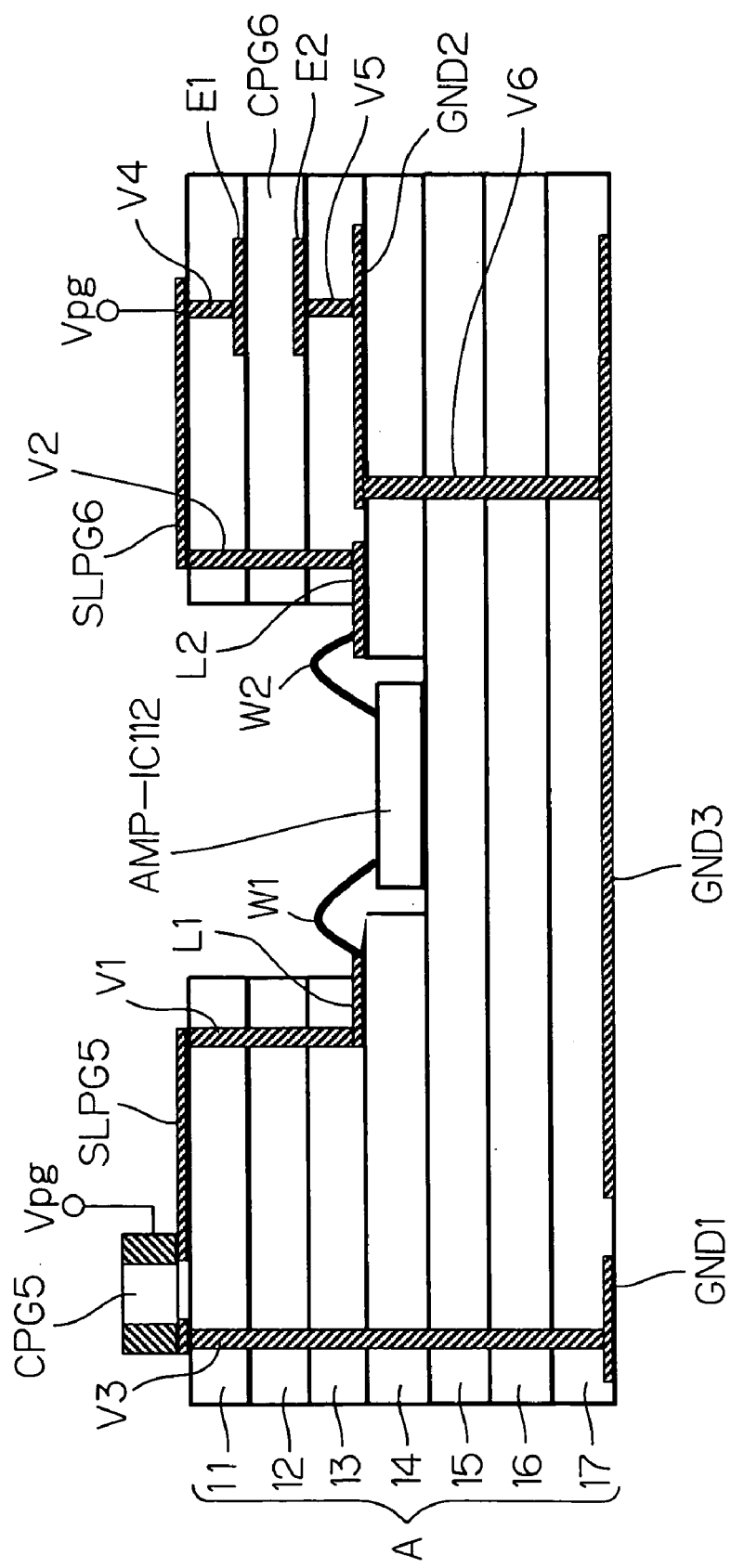
Figure 13:
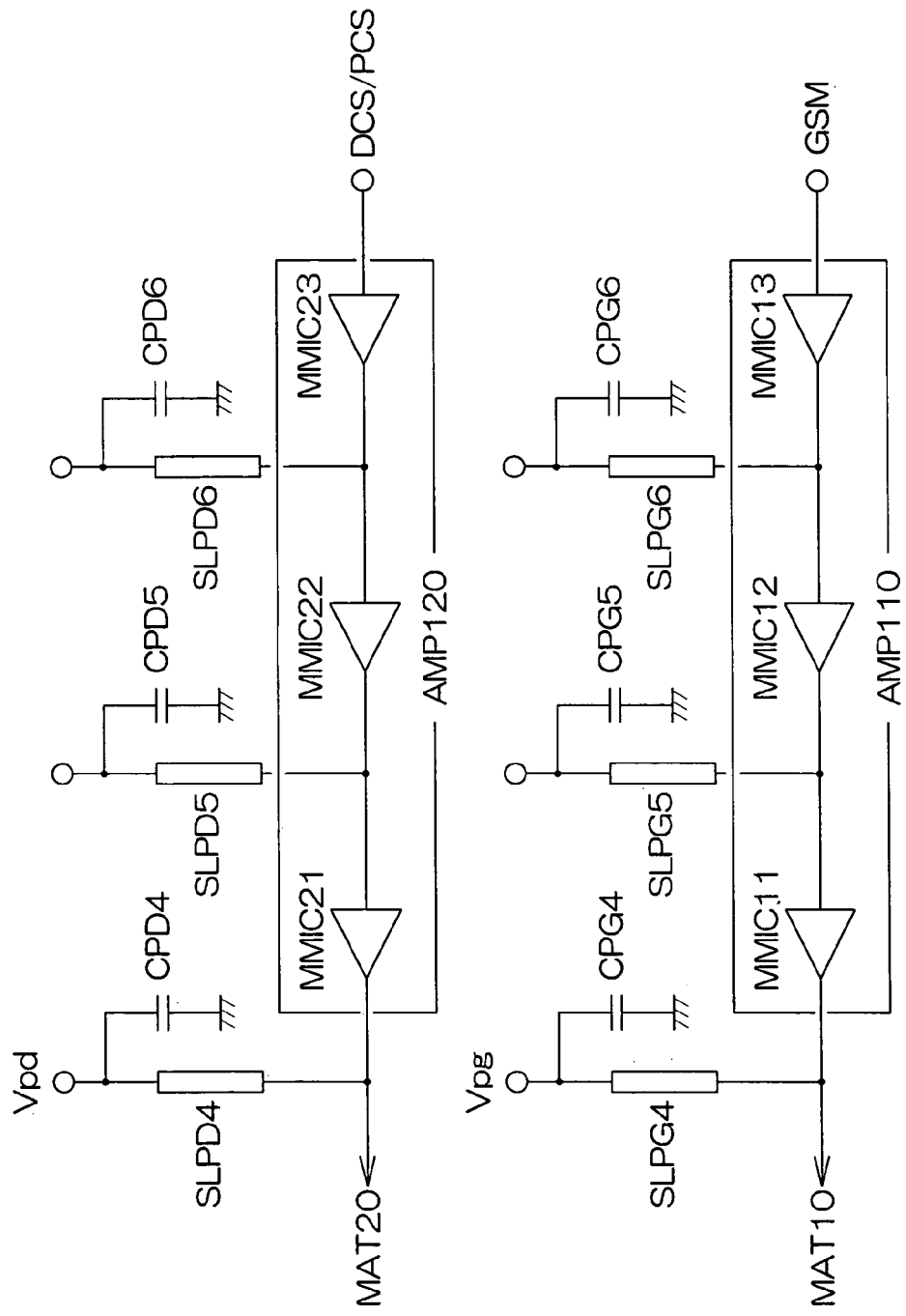
Figure 14:
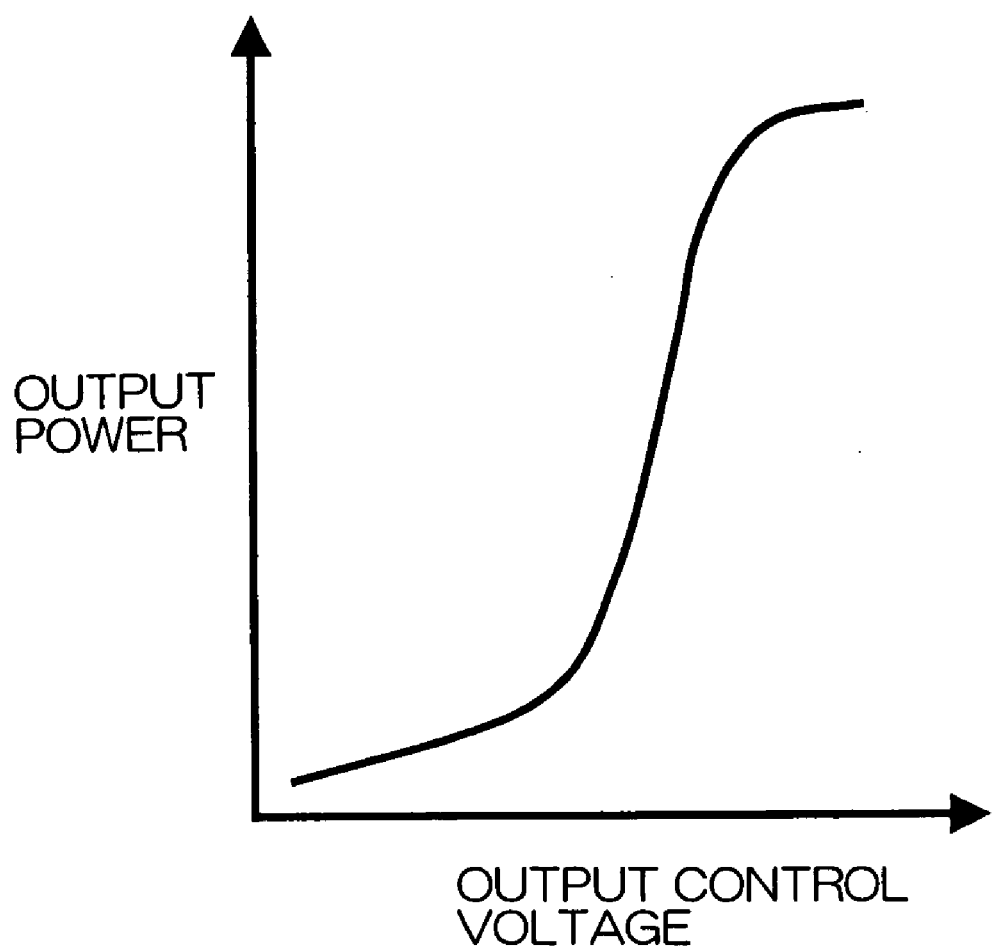
Figure 15:
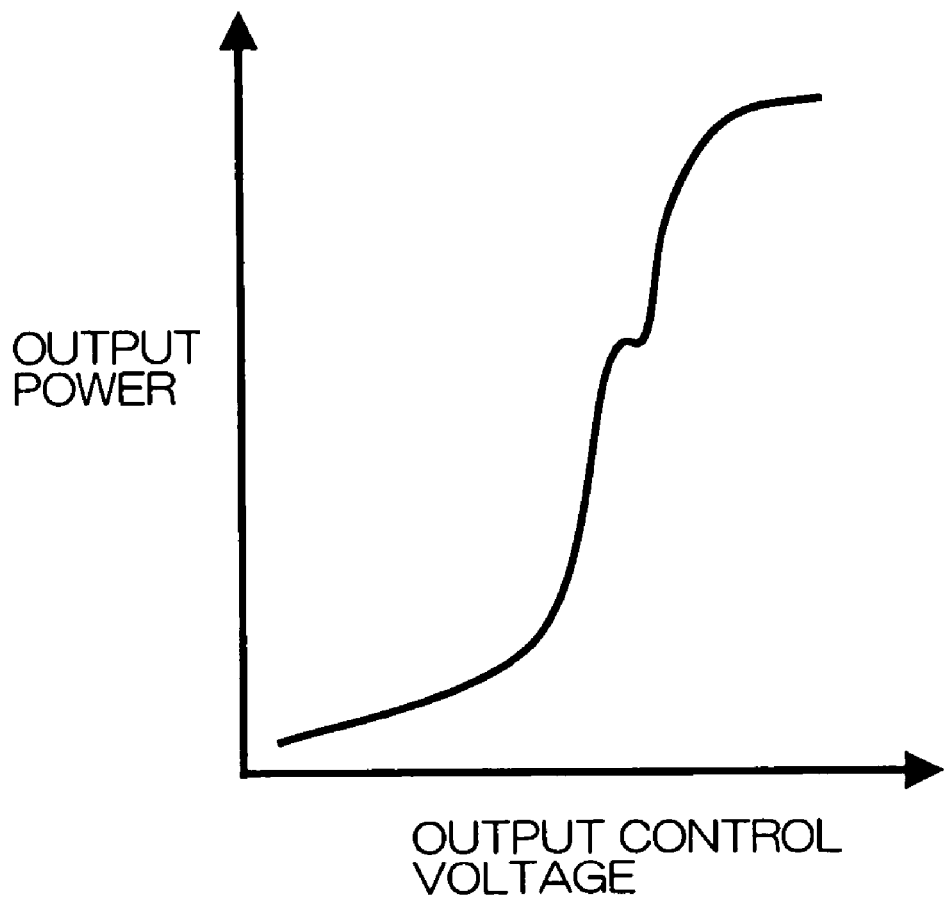
Figure 16:
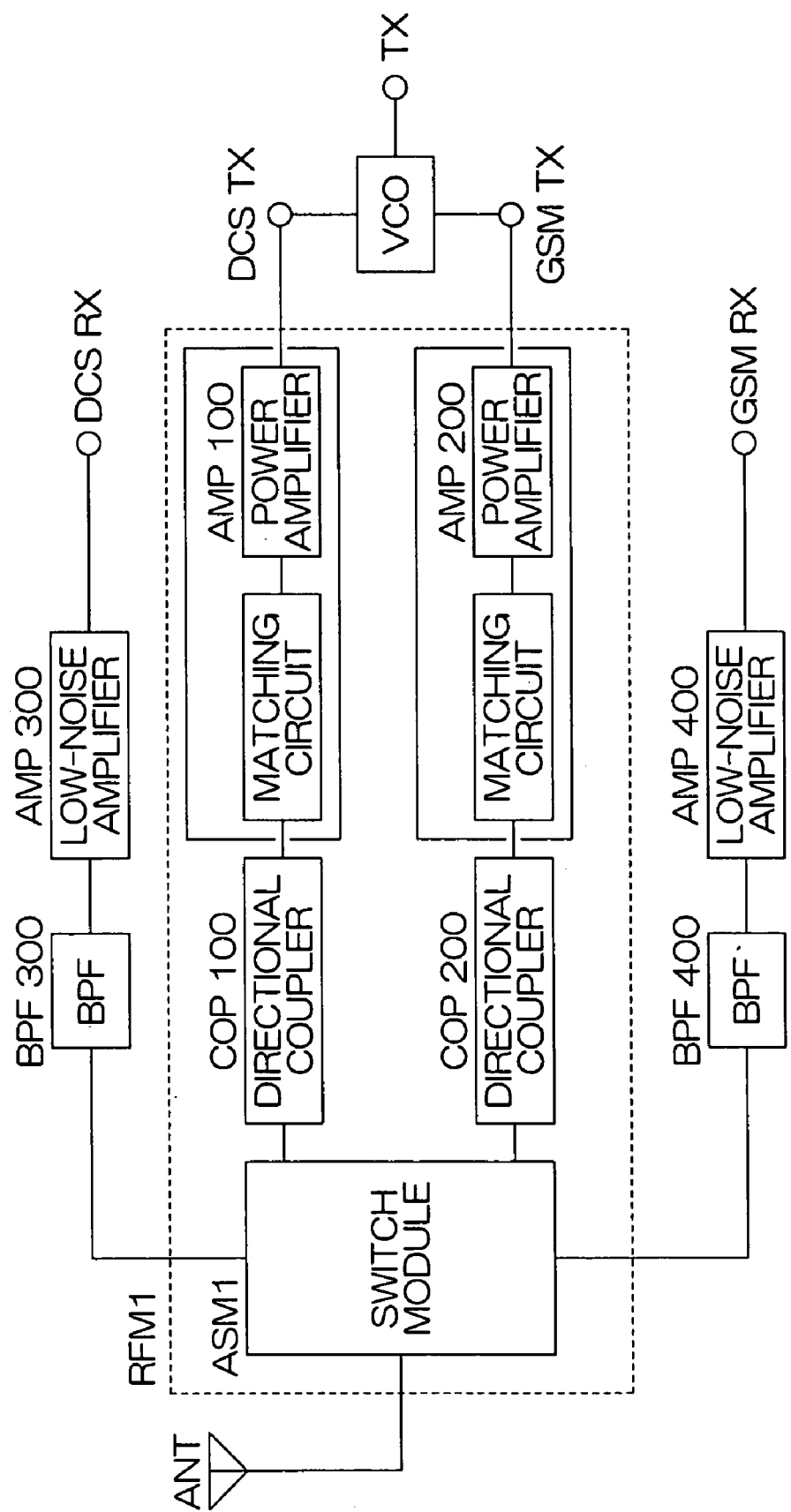

Each of FIG. 10A to FIG. 10E is a view illustrating another example of the terminal patterns on the underside of the multi-layer substrate A;

FIG. 11 is a circuit diagram of main portions of a high-frequency amplifier circuit of a high-frequency module of the present invention;

FIG. 12 is a schematic section view of a high-frequency module of another feature of the present invention;

FIG. 13 is a circuit diagram of main portions of another example of the high-frequency amplifier circuit of the high-frequency module of the present invention;

FIG. 14 is a view illustrating the electric characteristics of the high-frequency amplifier circuit of a high-frequency module of the present invention;

FIG. 15 is a view illustrating the electric characteristics of a high-frequency amplifier circuit of a high-frequency module of prior art; and FIG. 16 is a block diagram of the high-frequency module of prior art.

DESCRIPTION OF THE PREFERRED EMBODIMENTS

Figure 1:
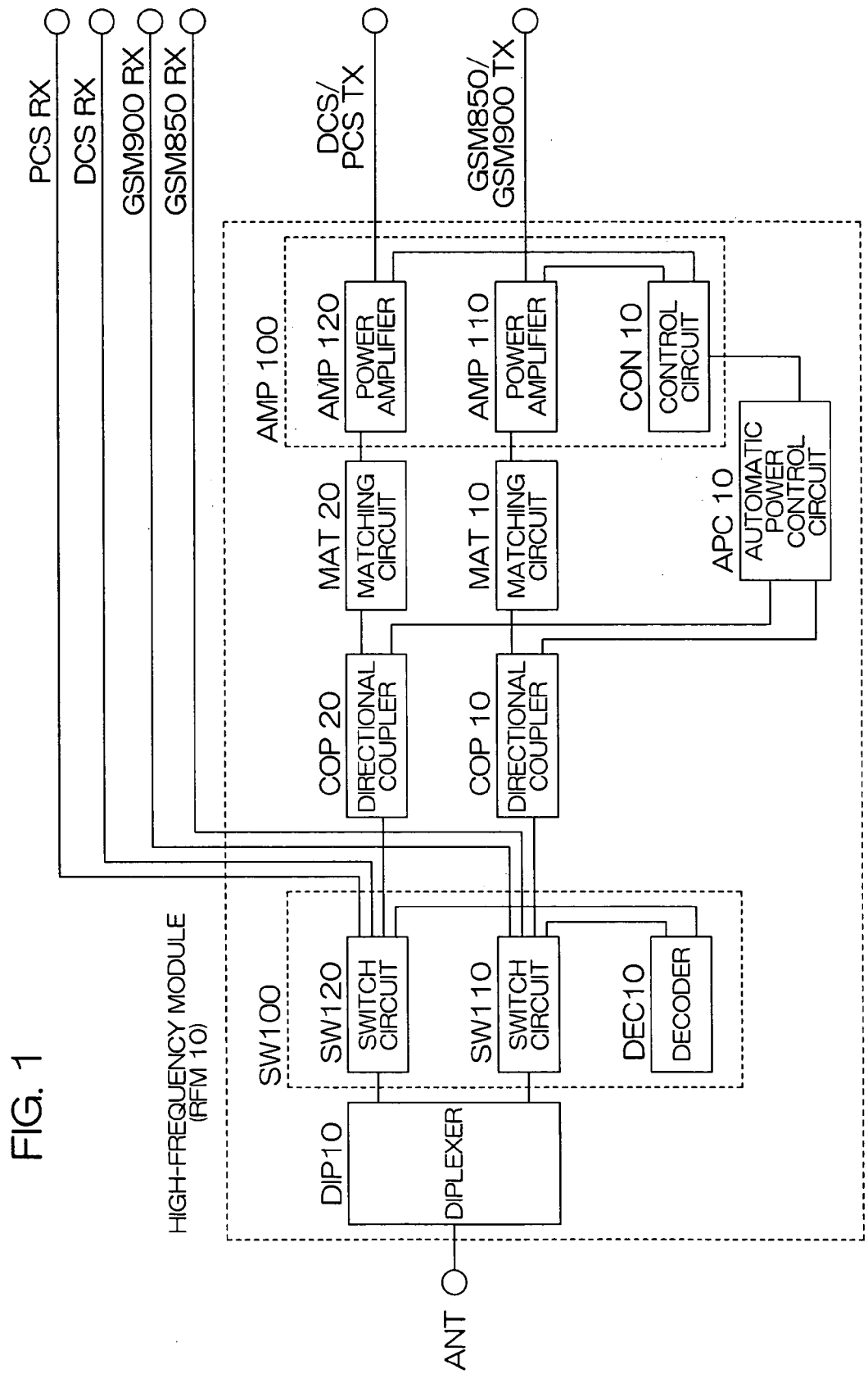
FIG. 1 is a block diagram of a high-frequency module of the present invention.

FIG. 1 is a block diagram illustrating an example of a high-frequency module according to the present invention.

A high-frequency module RFM10 comprises a common antenna terminal ANT, and four transmission/reception systems, that is, a GSM850 system (850 MHz band), a GSM900 system (900 MHz band), a DCS system (1800 MHz band), and a PCS (Personal Communication Services) system (1900 MHz band), these four systems being connected to the antenna terminal ANT.

The high-frequency module RFM10 in FIG. 1 comprises: a diplexer DIP10 for branching, with respect to the antenna terminal ANT, two transmission/reception systems GSM850/GSM900 and DCS/PCS different in pass band from each other, into individual transmission/reception systems; switches SW110, SW120 for switching each of the transmission/reception systems GSM850/GSM900 and DCS/PCS to the transmission systems TX and the reception systems RX; and a decoder DEC10 for controlling the states of the switches.

The high-frequency module RFM10 further comprises: power amplifiers AMP110, AMP120 for amplifying input signals which enters the GSM850/GSM900 TX terminal and the DCS/PCS TX terminal; matching circuits MAT10, MAT20 for adjusting the output impedances or the like of the power amplifiers AMP110, AMP120; directional couplers COP10, COP20 for taking out monitor signals in proportion to the outputs of the power amplifiers AMP110, AMP120; an automatic power control circuit APC10 for supplying, according to the monitor signals taken out from the directional couplers COP10, COP20, signals for controlling the power amplifiers AMP110, AMP120; and a control circuit CON10 for controlling the power amplifiers AMP110, AMP120 based on the output signals from the automatic power control circuit APC10.

The matching circuits MAT10, MAT20 have a function of converting the output impedances 0.5~2 Ω of the power amplifiers AMP110, AMP120, into 30~50 Ω for adjusting the impedances between the power amplifiers AMP110, AMP120 and the directional couplers COP10, COP20, and also have a function of attenuating harmonic components generated in the power amplifiers.

Figure 2:
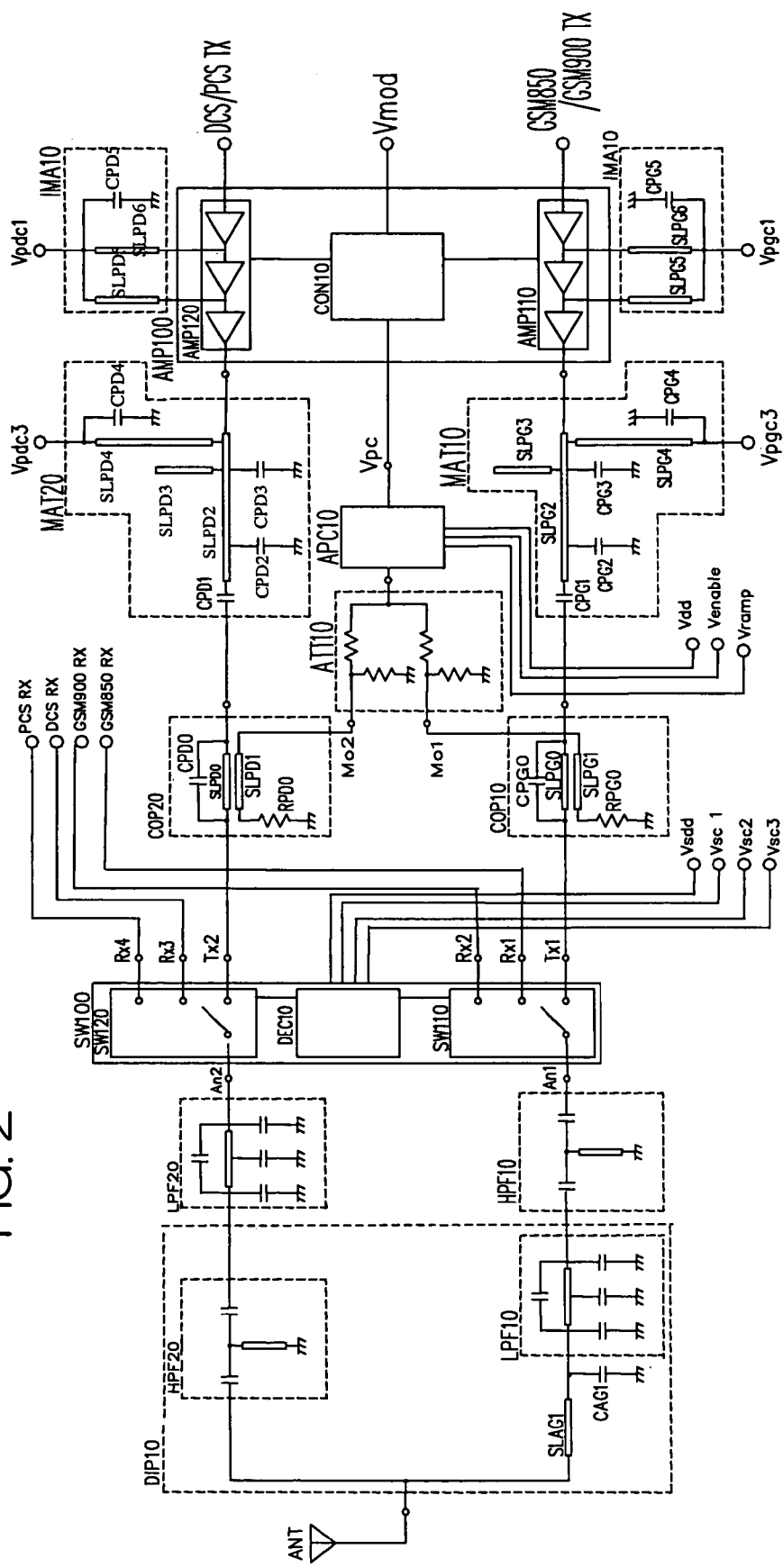
FIG. 2 is a circuit diagram of the high-frequency module shown in FIG. 1.

FIG. 2 is a detailed circuit diagram of the high-frequency module shown in FIG. 1.

In FIG. 2, the antenna terminal ANT is connected to the switch circuits SW110, SW120 through the diplexer DIP10. A reception signal of the GSM850/GSM900 system received from the antenna terminal ANT, is sent to the transmission/reception system at the GSM850/GSM900 side through the diplexer DIP10, and a reception signal of the DCS/PCS system is sent to the transmission/reception system at the DCS/PCS side through the diplexer DIP10.

The following description will discuss a schematic circuit arrangement at the GSM850/GSM900 side.

The switch SW110 is arranged to switch the reception system RX and the transmission system TX. For switching the transmission/reception, a time-sharing system is for example adopted.

Disposed at the transmission system TX side of the switch circuit SW110 are: the power amplifier AMP110 for amplifying a signal entered from the outside of the high-frequency module through the GSM850/GSM900 TX terminal; the matching circuit MAT10 of the power amplifier AMP110; the directional coupler COP10 connected to the matching circuit MAT10; the automatic power control circuit APC10 connected to a coupling line SLPG1 of the directional coupler COP10 through an attenuation circuit ATT10 for controlling the output of the power amplifier AMP110; and the control circuit CON10.

The schematic circuit arrangement at the DCS/PCS side is similar to that at the GSM850/GSM900 side, and the description is therefore omitted.

As to the details of the circuits above-mentioned, the following description will first discuss the circuits at the GSM850/GSM900 side.

The diplexer DIP10 is formed by a distributed constant line SLAG1, a capacitor CAG1 and a low-pass filter LPF10.

The low-pass filter LPF10 is formed by a distributed constant line, a capacitor in parallel to the distributed constant line, and a capacitor formed between the distributed constant line and the ground. This low-pass filter LPF10 has a function of reducing a harmonic distortion component generated by the power amplifier AMP 110 and the switch circuit SW110, and also has a function of branching, according to the frequency, a signal from the antenna terminal into the transmission/reception system GSM850/GSM900 and the transmission/reception system DCS/PCS.

A high-pass filter HPF10 has a function of protecting the switch SW110 from a high-voltage surge such as ESD or the like entered to the ANT terminal, and also has a function of matching the diplexer and the switch circuit to each other.

The switch SW110 is arranged to switch an output An1 terminal of the high-pass filter HPF10 to a transmission system Tx1 terminal of GSM850/GSM900, a reception system Rx1 terminal of GSM850, or a reception system Rx2 terminal of GSM900. Thus, the switch SW110 has a function of switching the transmission/reception, and also has a function of attenuating the amount of leak of a transmission signal to the reception side at the transmission time.

The switch SW110 is connected to the decoder DEC10. The decoder DEC10 is arranged to control the switch SW110 according to the voltages applied to bias terminals Vsc1, Vsc2, Vsc3 from the outside.

The power amplifier AMP110 is formed by three-stage high-frequency amplifying elements at the first, intermediate and last stages. Voltages are respectively supplied to the high-frequency amplifying elements through voltage supply bias lines SLPG6, SLPG5, SLPG4. With these voltages serving as an energy source, an input signal entered to the GSM850/GSM900 TX terminal is amplified. Provision is made such that the voltage supply bias lines SLPG6, SLPG5, SLPG4 serve as stub having a ¼ wavelength with respect to high frequency. This prevents a high-frequency signal from entering the direct-current voltage source.

The matching circuit MAT10 is formed by distributed constant lines SLPG2~SLPG4 and capacitors CPG1~CPG4. In the matching circuit MAT10, a low-pass filter is formed by the distributed constant line SLPG2 and the capacitors CPG2, CPG3. This low-pass filter has a function of matching the output impedance (about 0.5~about 2 Ω) of the power amplifier AMP110 and the input impedance (about 30~about 50 Ω) of the directional coupler COP10 to each other, and also has a function of reducing an unnecessary signal generated from the power amplifier AMP110.

The distributed constant line SLPG3 forms an open stub. This distributed constant line SLPG3 has a function of matching the output impedance (about 0.5~about 2 Ω) of the power amplifier AMP110 and the input impedance (about 30~about 50 Ω) of the directional coupler COP10 to each other, and also has a function of restraining a harmonic component and maximizing the amplifying performance of the power amplifier AMP110.

The capacitor CPG1 has a function of preventing a DC component from entering the input side of the power amplifier AMP110.

An interstage matching circuit IMA10 has a function of adjusting the interstage impedances among the three-stage high-frequency amplifying elements. The distributed constant lines SLPG5, SLPG6, and a capacitor CPG5 are disposed, in the three-stage power amplifier AMP110, between the intermediate-stage amplifier and the last-stage amplifier, and between the first-stage amplifier and the intermediate-stage amplifier. These lines and capacitor are arranged to match the interstage impedances to one another.

The directional coupler COP10 forms a low-pass filter comprising a distributed constant line SLPG0 and a capacitor CPG0. This low-pass filter can reduce an unnecessary signal generated from the power amplifier AMP110. The directional coupler COP10 does not necessarily have a function of a low-pass filter. That is, the directional coupler COP10 may not comprise a capacitor and may be formed only by the distributed constant line SLPG0 for allowing the frequency in the GSM band to pass.

The coupling line SLPG1 is disposed in the vicinity of the distributed constant line SLPG0 to form a capacity coupling and a magnetic coupling. Accordingly, a part of an output from the power amplifier AMP110 at the transmission circuit TX side, is taken out as a monitor signal and then entered into the attenuation circuit ATT10 through a monitor terminal Mo1.

The monitor signal is attenuated by the attenuation circuit ATT10 and entered into the automatic power control circuit APC10. A terminating resistance RPG0 is connected to the switch SW110 side of the coupling line.

The attenuation circuit ATT10 also has a function of adjusting the impedance between the directional coupler and the automatic power control circuit.

The automatic power control circuit APC10 is arranged to generate and supply a control signal of the power amplifier AMP110 according to the monitor signal entered through the attenuation circuit ATT10. The control signal is returned to the power amplifier AMP110 through the control circuit CON10. The automatic power control circuit APC10 is connected to bias terminals $V_{dd}$, $V_{enable}$, $V_{ramp}$ and the like. These bias terminals are arranged to control, from the outside of the high-frequency module, the state of the automatic power control circuit APC10.

The control circuit CON10 has a function of switching, according to the voltage of a terminal $V_{mod}$, the power amplifier AMP110 and the power amplifier AMP120 which is to be operated.

As to the details of the circuits at the DCS/PCS side, the following description will discuss only portions different from the circuits at the GSM850/GSM900 side.

The DCS/PCS side of the diplexer DIP10 is formed by a high-pass filter HPF20.

The high-pass filter HPF20 is formed by two capacitors connected to each other in series and a distributed constant line disposed between the ground and an intermediate part between these capacitors. This high-pass filter HPF20 has a function of branching, according to the frequency, a signal from the antenna terminal into the transmission/reception system GSM850/GSM900 and the transmission/reception system DCS/PCS. A low-pass filter LPF20 has a function of reducing a harmonic distortion component generated by the power amplifier AMP120 and the switch SW120, and also has a function of matching the diplexer and the switch to each other.

The arrangement of other circuits at the DCS/PCS side is similar to that of the circuits at the GSM850/GSM900 side, and the description is therefore omitted.

Figure 3:
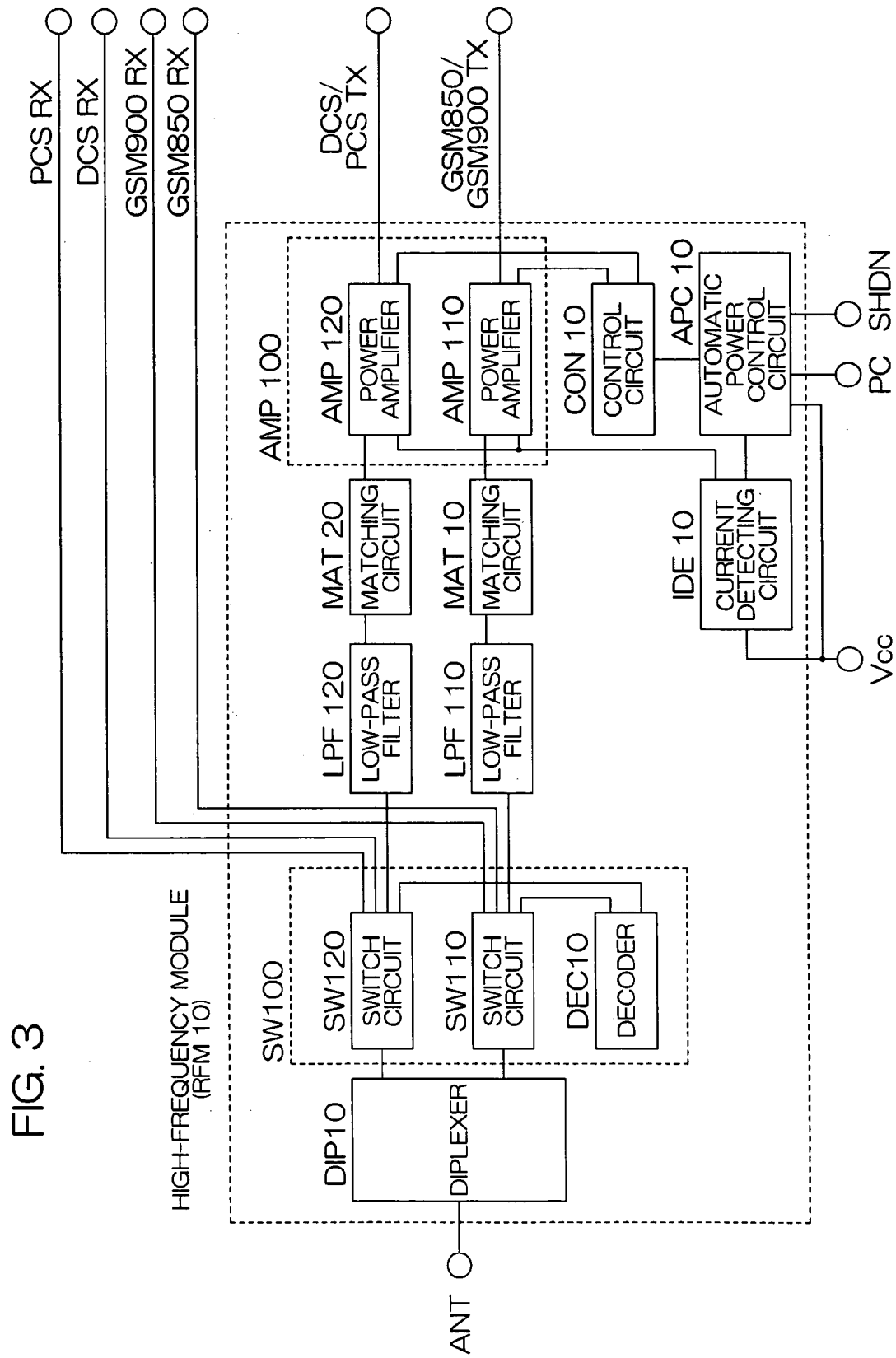
FIG. 3 is a block diagram of another high-frequency module of present invention.

FIG. 3 is a block diagram of the high-frequency module RFM10, in which the amounts of electric currents flowing in the power amplifiers AMP110, AMP120 are detected, thereby to eliminate the directional couplers COP10, COP20 which detect the powers supplied from the power amplifiers AMP110, AMP120.

As shown in FIG. 3, the high-frequency module RFM10 comprises a control circuit CON10 for switching the operation of the power amplifiers AMP110, AMP120, an automatic power control circuit APC10 for controlling outputs of the power amplifiers AMP110, AMP120, and a current detecting circuit IDE10 for detecting the amount of an electric current flowing into the power amplifier AMP100.

Figure 4:
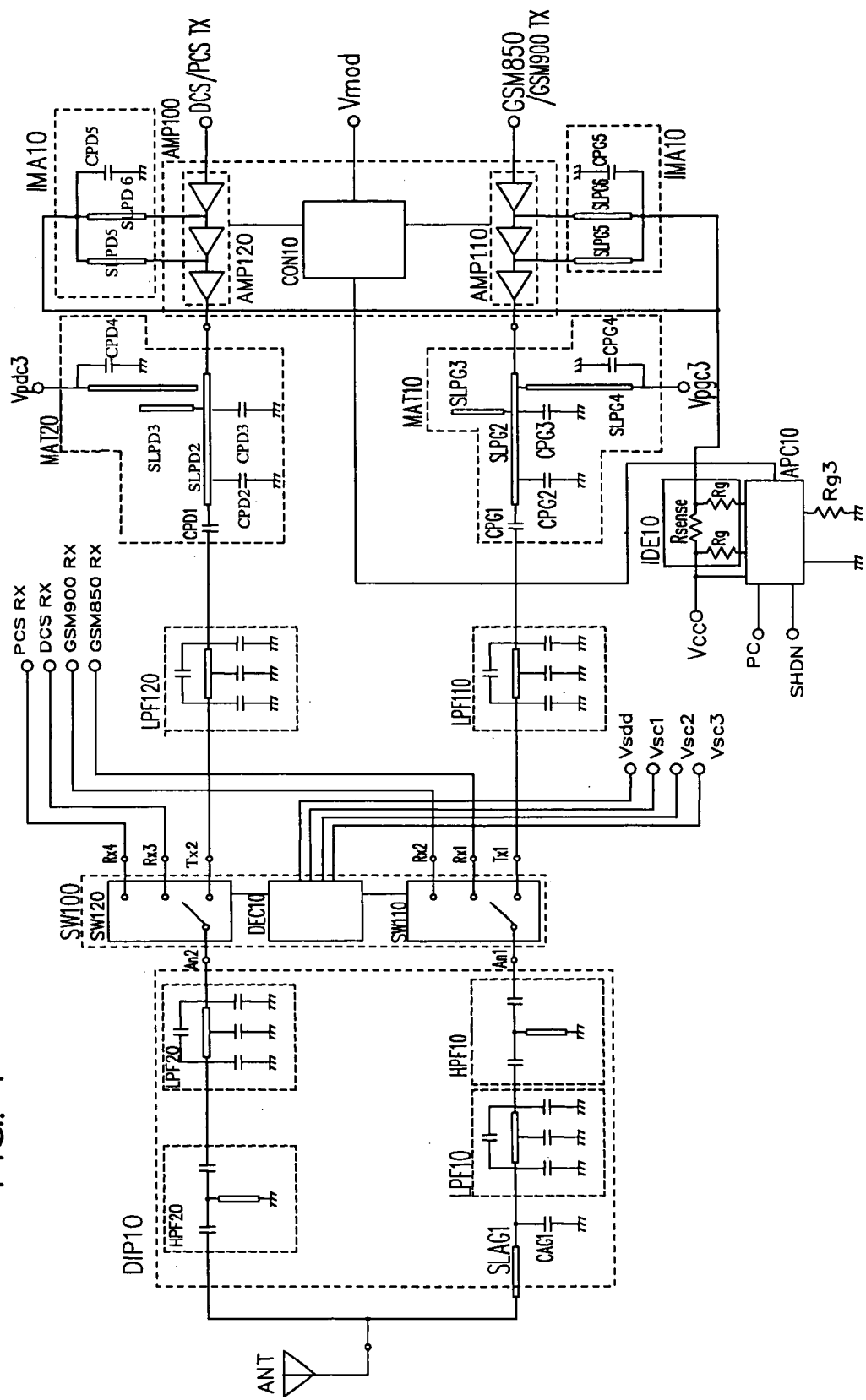
FIG. 4 is a circuit diagram of the high-frequency module shown in FIG. 3.

FIG. 4 is a detailed circuit diagram of the high-frequency module RFM10 shown in FIG. 3.

In FIG. 4, the current detecting circuit IDE10 is arranged to detect the amounts of electric currents flowing into the power amplifiers AMP110, AMP120 from a power source $V_{cc}$ through the current detecting circuit IDE10. The current detecting circuit IDE10 is formed by a circuit comprising a resistance $R_g$ and a resistance $R_{sense}$ for detecting the current amounts. The resistance $R_{sense}$ is arranged to generate a voltage drop by an electric current flowing in the resistance $R_{sense}$.

When a large value is given to the resistance $R_{sense}$, the current detecting sensitivity is improved. However, due to a large voltage drop generated at the resistance $R_{sense}$, the desired voltages cannot be applied to the power amplifiers AMP110, AMP120, and a necessary power cannot be taken out at the transmission time. Therefore, $R_{sense}$ preferably has a small value of about 50 m$\Omega$.

The automatic power control circuit APC10 is arranged to supply a control signal to the control circuit CON10 according to a current detecting output of the current detecting circuit IDE10.

The control circuit CON10 has a function of controlling the magnitudes of outputs of the power amplifiers AMP110, AMP120 according to the signals from the automatic power control circuit APC10, and also has a function of switching, according to a signal $V_{mod}$, the power amplifiers AMP110, AMP120 which is to be operated.

An LPF110 has a function, similar to that of the directional coupler COP10, of reducing an unnecessary signal generated from the power amplifier AMP110.

In the foregoing, the description has specifically been made on the circuits at the GSM850/GSM900 side. As shown in FIGS. 3 and 4, the circuits at the DCS/PCS side have an arrangement similar to that of the circuits at the GSM850/GSM900 side, and the description is therefore omitted.

The following description will discuss the mounting state of the component elements forming the high-frequency module RFM10 of the present invention.

The high-frequency module REM10 is mounted, as a component element, on the surface or inside of a multi-layer substrate comprising dielectric layers and conductor layers alternately laminated one after the other. When the high-frequency module RFM10 is mounted on the surface or inside of the multi-layer substrate, this includes the case in which the component elements of the high-frequency module RFM10 are formed by a conductor circuit pattern on the surface or inside of the multi-layer substrate.

According to the present invention, switches SW110, SW120 are integrated in a single high-frequency semiconductor integrated circuit element (hereinafter referred to as an SW-IC element) as designated by SW100 in FIGS. 1 and 3. The decoder DEC10 is preferably integrated in the SW-IC element, but may be formed as a separate electric part outside of the high-frequency module.

The SW-IC element forming the switches SW110, SW120 is made in the form of a switch circuit pattern on a substrate of which chief ingredient is a GaAs (gallium arsenide) compound. This structure contributes to reduction both in size and loss.

In the high-frequency module of the present invention, the power amplifiers AMP110, AMP120 are also formed by a high-frequency semiconductor integrated circuit element (hereinafter referred to as an AMP-IC element) as designated by AMP100 in FIGS. 1 and 3. The control circuit CON10 is preferably integrated in the AMP-IC element, but may be formed, as a separate part, on the surface or inside of the high-frequency module.

In the AMP-IC element, a HBT (heterojunction bipolar transistor) structure or a P-HEMT (high-mobility transistor) structure, is formed on a semiconductor substrate made of GaAs (gallium arsenide), InGaP (indium gallium phosphide) or Si (silicon) or the like. In view of miniaturization and higher efficiency, the AMP-IC element is preferably made of a semiconductor element having a GaAs HBT structure.

In view of miniaturization, the automatic power control circuit APC10 is preferably mounted, as a semiconductor integrated circuit element (hereinafter referred to as an APC-IC element), on the top of the multi-layer substrate. However, the automatic power control circuit APC10 may also be integrated in the AMP-IC element, or may be formed, as a separate electric component, outside of the high-frequency module.

The automatic current detecting circuit IDE10 is formed by passive components such as resistance elements, and can therefore be mounted as a chip part on the multi-layer substrate.

In the transmission high-frequency module RFM10 of the present invention, other circuits than those above-mentioned, i.e., the diplexer DIP10, the output matching circuits MAT10, MAT20, the interstage matching circuits IMA10, IMA20, the directional couplers COP10, COP20 and the like, may be formed in the following manner. That is, portions of the capacitors, the inductors and the like forming these circuits, are disposed, as chip components (lumped constant elements), on the top of the multi-layer substrate, or portions of the capacitors, the inductors and the like forming these circuits, are formed, as a conductor pattern, on the top or inside of the multi-layer substrate.

To further miniaturize the high-frequency module in a cellular phone or the like, a voltage-controlled oscillator circuit VCO or balun (not shown) connected to the GSM850/GSM900 TX terminal and the DCS/PCS TX terminal in FIG. 1, may be made in a unitary structure inside of the high-frequency module shown in this embodiment.

Further, the function of the directional couplers COP10, COP20 may be integrated in the AMP-IC element. Further, the directional couplers may not be disposed, but provision may be made such that monitor signals are taken out from portions of the distributed constant lines forming the matching circuits of the power amplifiers.

To further miniaturize the high-frequency module in a cellular phone or the like, band-pass filters such as SAW filters, FBAR filters and the like (not shown) connected to the GSM850-RX terminal, the GSM900-RX terminal, the DCS-RX terminal and the PCS-RX terminal in FIG. 1, may be made in a unitary structure inside of the high-frequency module of this embodiment.

When the series capacitor CPG1 is formed as an element mounted on the top of the multi-layer substrate, the directional coupler COP10 and the matching circuit MAT10 can individually be evaluated when checking the elements incorporated in the multi-layer substrate for electric failure.

Figure 5:
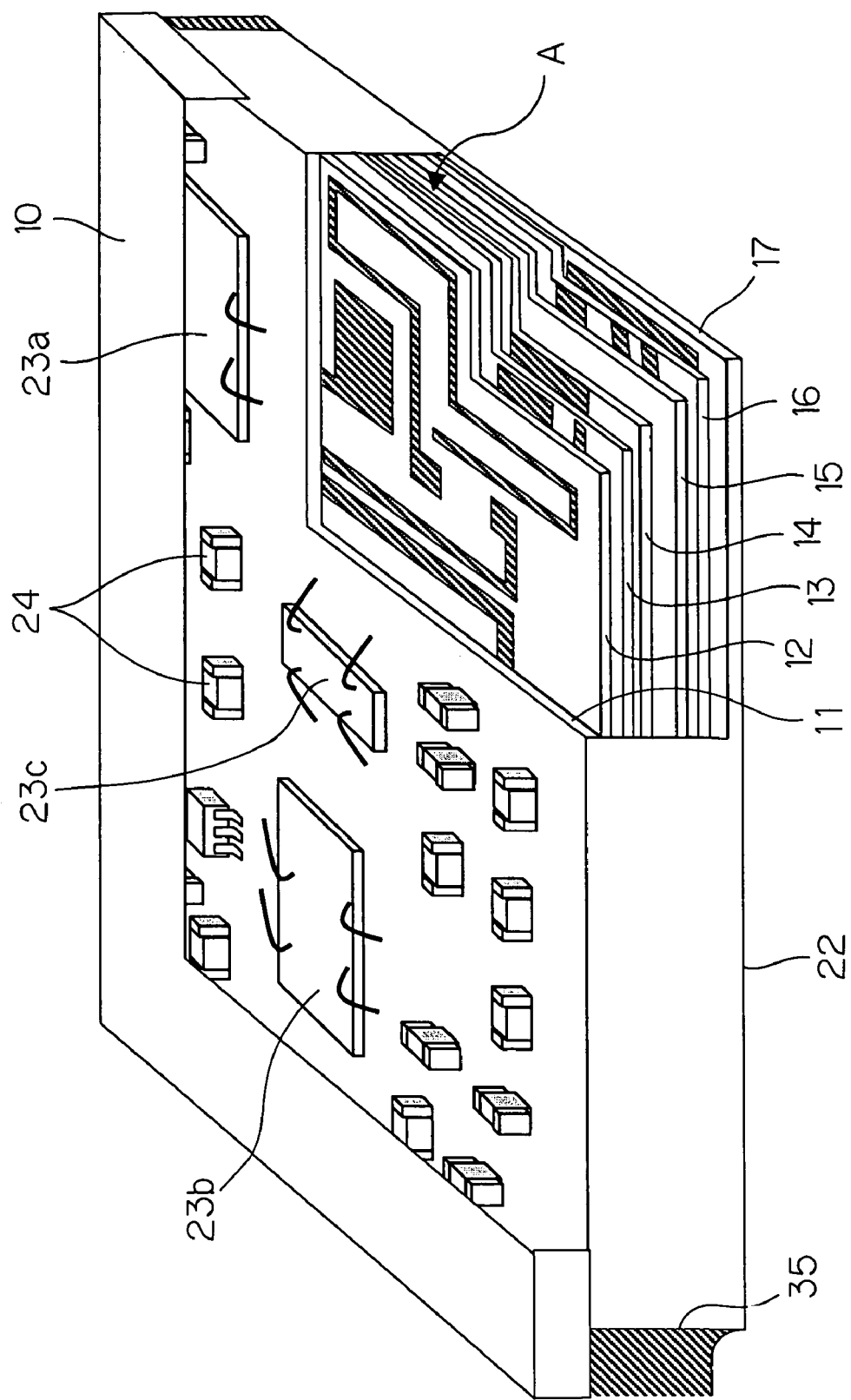
FIG. 5 is a perspective view, with portions broken away, of a high-frequency module of the present invention.

FIG. 5 is a perspective view, with portions broken away, of a high-frequency module of the present invention.

As shown in FIG. 5, there is formed, in the high-frequency module, a multi-layer substrate A in which dielectric layers 11~17 made of ceramics or the like having the same sizes and shape, are laminated one after another. The top and the lateral sides of the multi-layer substrate A are coated with a shield cover 10 made of metal. A signal terminal pattern 22 is formed, as an electrode of the LGA (land grid array) type, on the underside of the multi-layer substrate A and in the vicinity of the lateral sides thereof.

By a conductor such as soldering or the like, the shield cover 10 is secured to at least one of grounding end-face electrodes 35 disposed at predetermined positions of lateral sides of the high-frequency module.

Mounted on the uppermost dielectric layer 11 are: various patterns; high-frequency monolithic semiconductor integrated circuits such as an AMP-IC element 23a, an SW-IC element 23b, an APC-IC element 23c and the like; and a plurality of chip components (lumped constant elements) 24 such as capacitors, inductors and the like.

The dielectric layers 11~17 are made of a dielectric material such as ceramics, a synthetic resin, a composite material of ceramics and a synthetic resin, or the like. To form microscopic circuits and in view of multilayer circuit configuration and higher reliability, the dielectric layers 11~17 are preferably made of ceramics. Particularly, in view of simultaneous sintering with the conductor layers, it is preferable to use ceramics which can be sintered at 800~1000° C. For example, glass or glass ceramics may suitably be used.

The following description will discuss a specific method of producing this multi-layer substrate A. Alumina, mullite, forsterite, aluminium nitride, silicon nitride, glass or the like is used as a base, and known sintering aids or a compound of titanate which contributes to a higher relative dielectric constant, are mixed and added to this base, thus forming a ceramic green sheet.

On the surface of this ceramic green sheet, a conductor layer is formed by at least one low-resistance conductor preferably selected from the group consisting of copper, silver and gold. As to the conductor layer forming method, a conductor paste containing the metal above-mentioned may be applied to the surface of the ceramic green sheet, or a metallic foil is attached thereto.

After the conductor patterns forming the circuits above-mentioned have been formed, ceramic green sheets having conductor patterns formed thereon are laminated on conductor patterns. The laminated body is thermally compressed and baked under a predetermined pressure at a predetermined temperature. In this case, via-hole conductors comprising through-holes filled with a conductor paste, are suitably formed in the dielectric layers 11~17 such that circuits formed throughout a plurality of layers are connected in the thickness direction.

Then, the ceramic green sheets are sintered simultaneously with these low-resistance metals.

In the high-frequency module of the present invention, the relative dielectric constant of the dielectric layers forming the multi-layer substrate, is preferably not less than 4, and more preferably 8 or more. By increasing the relative dielectric constant of the dielectric layers in this way, the distributed constant lines forming the circuits can be shortened in length, and the facing areas of the capacitor elements can also be reduced. This contributes to miniaturization of the high-frequency module.

Figure 6:
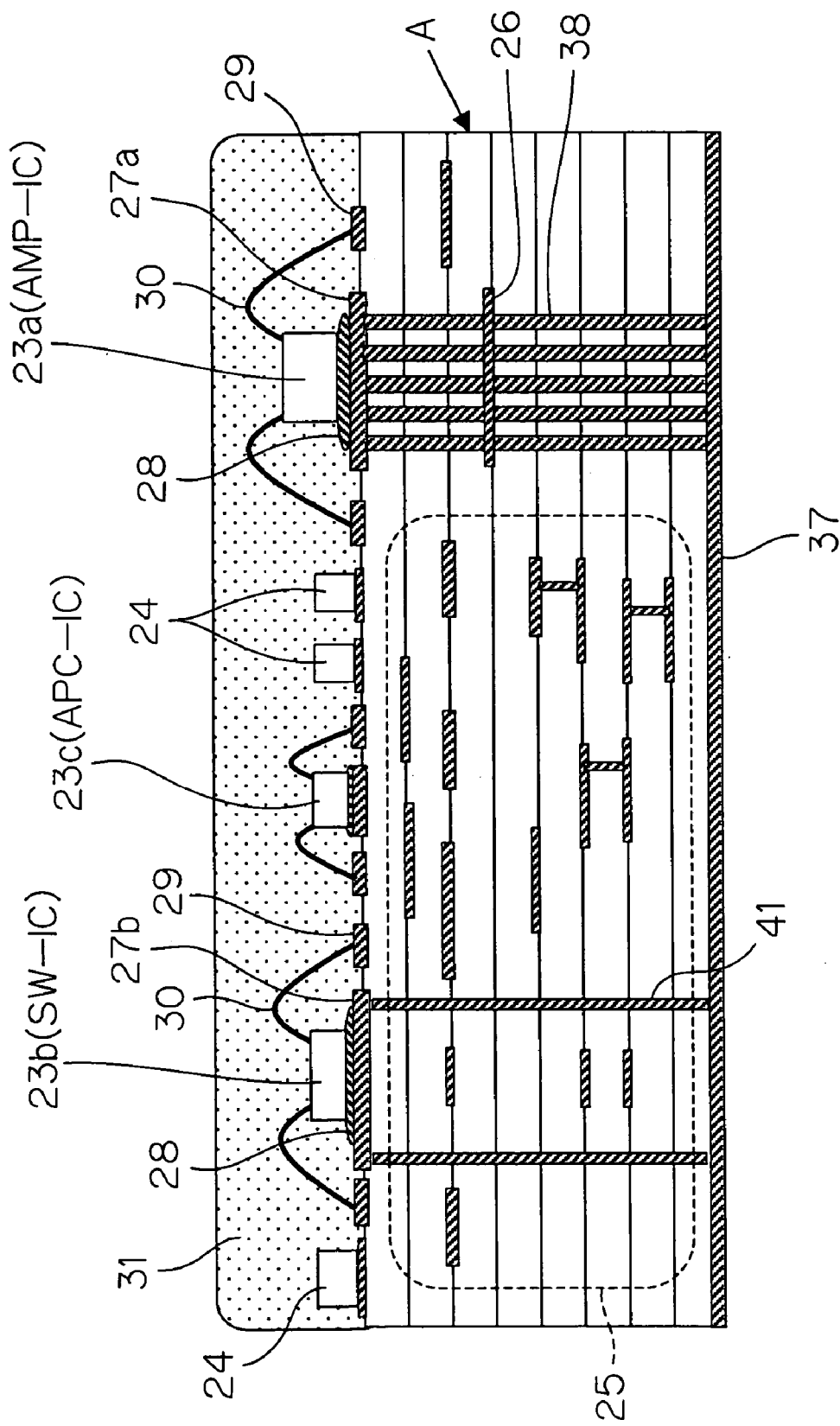
FIG. 6 is a schematic section view of the high-frequency module of the present invention.

FIG. 6 is a schematic section view of the multi-layer substrate forming the high-frequency module of the present invention.

In FIG. 6, the semiconductor integrated circuit elements such as the AMP-IC element 23a, the SW-IC element 23b, the APC-IC element 23c and the like are mounted on the top of the multi-layer substrate A. A diplexer for branching a plurality of transmission/reception systems, directional couplers and matching circuits of power amplifiers, are formed by chip components 24 such as capacitors, inductors and the like on the top of the multi-layer substrate A, and internal elements 25 inside of the multi-layer substrate A.

The AMP-IC element 23a, the SW-IC element 23b and APC-IC element 23c are mounted on die pads 27a, 27b formed on the surface of the multi-layer substrate A with the use of conductive adhesives 28 such as Ag, AuSn or the like. The input/output electrodes of the AMP-IC element 23a, the SW-IC element 23b and the APC-IC element 23c, are connected to a signal pattern and a grounding pattern 29 formed on the surface of the multi-layer substrate A with the use of bonding wires 30 made of Au or the like.

The top of the multi-layer substrate A is sealed with a resin 31 of the epoxy type or the like. This not only perfectly secures the AMP-IC element 23a, the SW-IC element 23b and the APC-IC element 23c, but also prevents foreign matter from entering from the outside. This improves the reliability of the high-frequency module.

The following description will discuss an arrangement of elements inside of a multi-layer substrate forming the module of the present invention.

Figure 7A:
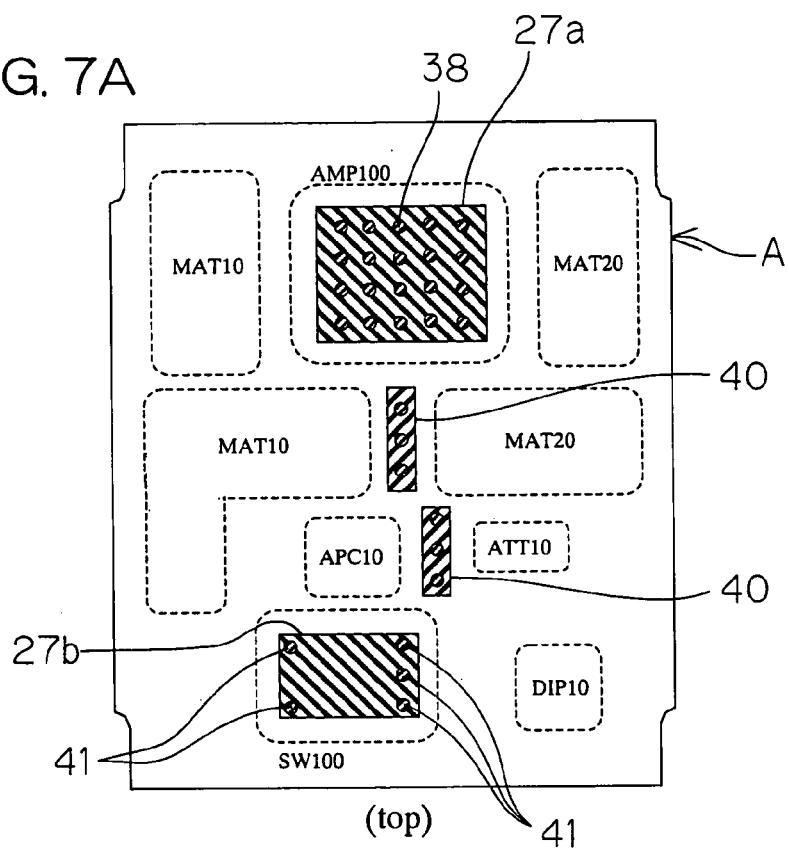
FIG. 7A is a view illustrating a circuit arrangement of the top of a multi-layer substrate for a high-frequency module of the present invention.
Figure 7B:
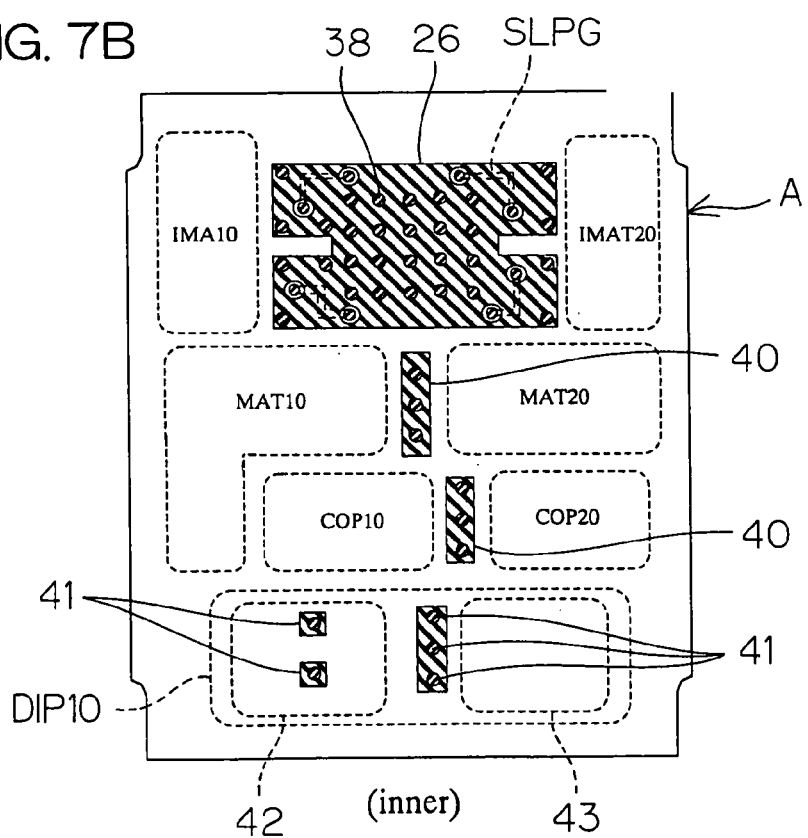
FIG. 7B is a view illustrating a circuit arrangement of an inner layer of the multi-layer substrate for a high-frequency module of the present invention.

FIG. 7A is a view illustrating an arrangement of the elements mounted on the top of a multi-layer substrate. FIG. 7B is a view illustrating an arrangement of the elements disposed on an inner layer of the multi-layer substrate.

With reference to FIG. 6, FIG. 7A and FIG. 7B, a multi-layer substrate forming the module of the present invention, is provided at one end in the longitudinal direction thereof with a power amplifier AMP100, and at the other end with a switch circuit SW100 and a diplexer DIP10.

Matching circuits MAT10, MAT20, directional couplers COP10, COP20 and the like are disposed between the power amplifier AMP100 and the switch circuit SW100.

In brief, the power amplifier AMP100, the matching circuits MAT10, MAT20, the directional couplers COP10, COP20, the switch circuit SW100 and the diplexer DIP10, are successively disposed on the substrate in the longitudinal direction or in the signal flowing direction in the shortest course. Such an arrangement eliminates a waste bypass line, thus minimizing both transmission loss and interference among the lines. It is therefore possible to bring out the electric performance of the module at a maximum.

As mentioned earlier, the power amplifier AMP100 is formed as the AMP-IC element 23a. As shown in FIG. 6, the AMP-IC element 23a is fixed onto the die pad 27a formed on the top of the multi-layer substrate A through conductive or nonconductive adhesives 28. The die pad 27a is connected to a ground terminal pattern 37 on the underside of the multi-layer substrate A by via-hole conductors 38. This assures passages for conducting heat to the outside of the module to prevent the AMP-IC element 23a from being increased in temperature beyond the guaranteed temperature.

The switch circuit SW100 is formed as the SW-IC element 23b in which the switches SW110, SW120, the decoder 10 and the like are being integrated. As shown in FIG. 6, the SW-IC element 23b is fixed onto a die pad 27b formed on the top of the multi-layer substrate A through the conductive or nonconductive adhesives 28. The die pad 27b is downwardly extended through via-hole conductors 41, and connected to the ground terminal pattern 37 on the underside of the multi-layer substrate A. If the die pad 27b is a floating pattern which is not connected to the ground terminal pattern 37, this produces unnecessary interference among the elements forming the diplexer disposed thereunder. However, this problem can be eliminated since the die pad 27b is connected to the ground terminal pattern 37. Further, the via-hole conductors 41 are disposed as connected in the vicinity of the outer periphery of the rectangular die pad 27b. This effectively prevents the ground of a portion of the outer periphery of the die pad 27b from getting weak to produce unnecessary interference.

The die pad 27a on which the AMP-IC element 23a is mounted, and the die pad 27b on which the SW-IC element 23b is mounted, are not connected directly to each other, but are independently formed. This prevents the SW-IC element 23b from being changed in characteristics or being defective due to the influence of heat from the AMP-IC element 23a.

As shown in FIG. 7B, the diplexer DIP10 comprises two portions, i.e., a portion 42 at the GSM850/GSM900 side formed by SLAG1, CAG1, LPF10 and HPF10, and a portion 43 at the DCS/PCS side formed by HPF20 and LPF20. Out of these two portions in this embodiment, the portion 42 at the GSM850/GSM900 side is formed in the region under the die pad 27b for the SW-IC element 23b, while the portion 43 at the DCS/PCS side is formed outside of the region under the die pad 27b.

As shown in FIG. 7B, the via-hole conductors 41 which connect the die pad 27b having the switch circuit SW100 mounted thereon, to the ground terminal pattern 37 on the underside of the multi-layer substrate, are formed between the portion 42 at the GSM850/GSM900 side and the portion 43 at the DCS/PCS side in the diplexer. Accordingly, the via-hole conductors 41 have a function of grounding the die pad 27b, and also have a function of preventing the interference between the GSM850/GSM900 side and the DCS/PCS side inside of the diplexer. This improves the pattern density inside of the multi-layer substrate, thus contributing to miniaturization of the high-frequency module.

FIG. 7B also shows an interference preventing ground pattern 26 connected to via-hole conductors 38. The shape and function of the interference preventing ground pattern 26 will be discussed later with reference to FIG. 8A and FIG. 8B.

Further, interference preventing patterns 40 each incorporating via-hole conductors are formed between the matching circuits MAT10 and MAT20, and between the directional couplers COP10 and COP20, these matching circuits MAT10, MAT20 and directional couplers COP10, COP20 being disposed on an inner layer of the multi-layer substrate. The interference preventing patterns 40 are downwardly extended from the top of the multi-layer substrate A and connected to the ground terminal patterns 37 on the underside of the multi-layer substrate.

The interference preventing patterns 40 reduce electromagnetic coupling between the circuits at the GSM850/GSM900 side and the circuits at the DCS/PCS side. This prevents harmonic components generated by the power amplifiers from leaking to other circuits due to electromagnetic coupling such that the harmonic components are discharged to the antenna terminal ANT without passing through proper filter circuits.

In the high-frequency module of the present invention, when the drive voltage of the AMP-IC element 23a is lowered, the power added efficiency and the output level of the AMP-IC element 23a are deteriorated. It is therefore preferable to use a low-resistance conductor such as silver or copper as a conductor material of the capacitor conductor patterns, the via-hole conductors and the distributed constant lines which form the matching circuits for supplying a voltage to the AMP-IC element 23a. This minimizes the drop of the drive voltage of the AMP-IC element 23a.

Figure 8A:
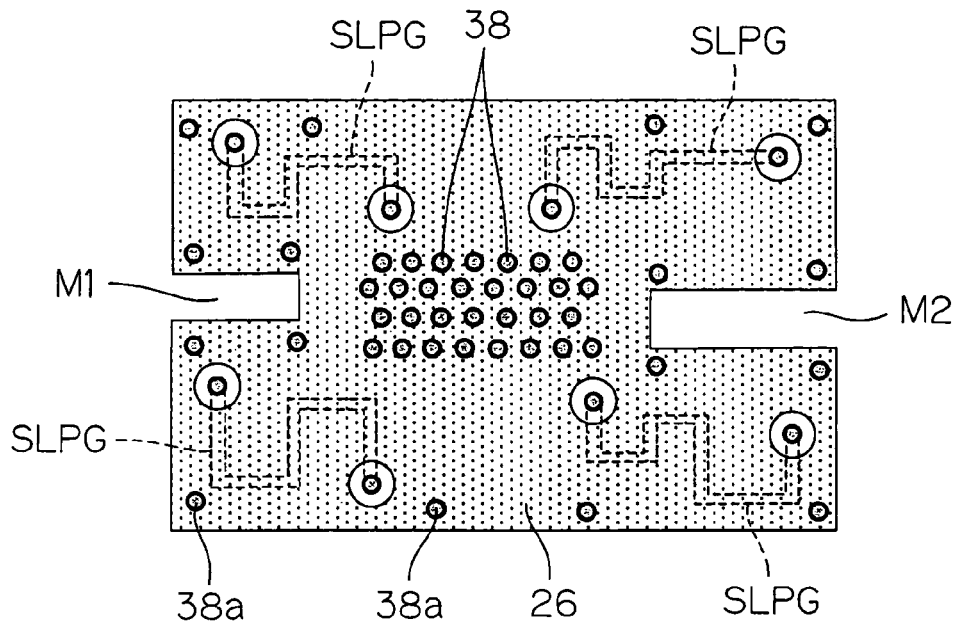
FIG. 8A is a view illustrating an interference preventing ground pattern in a high-frequency module of the present invention.

FIG. 8A is a view illustrating the shape of the interference preventing ground pattern 26 connected to via-hole conductors 38.

As apparent from FIG. 8A, voltage supply bias lines SLPG are so disposed as not to overlap one another in plan elevation.

The interference preventing ground pattern 26 has slits M1, M2. The slits M1, M2 are arranged to prevent harmonic signals flowing in voltage supply bias lines SLPG, from being electromagnetically connected to the interference preventing ground pattern 26, causing the harmonic signals to flow in other voltage supply bias lines SLPG through the interference preventing ground pattern 26. When the positions of slits M1, M2 are suitably selected, this prevents the interference in a high-frequency signal by a harmonic signal through the interference preventing ground pattern 26, thus preventing feedback of the harmonic signal to the first stage from the last stage of the high-frequency amplifying elements forming the power amplifiers. As a result, the harmonic signal level at the output terminal of the high-frequency module can be lowered, thus enabling the harmonic characteristics of the high-frequency module to be improved.

The interference preventing ground pattern 26 has via-hole conductors 38a around the pattern and the slits. These via-hole conductors 38a are connected to the ground pattern 37 on the underside of the multi-layer substrate A.

In the example in FIG. 8A, two slits are formed in the interference preventing ground pattern 26 at vertically dividing positions. However, the slit forming positions are not limited to the positions above-mentioned. The slits may be formed in the interference preventing ground pattern 26 at transversely dividing positions.

Figure 8B:
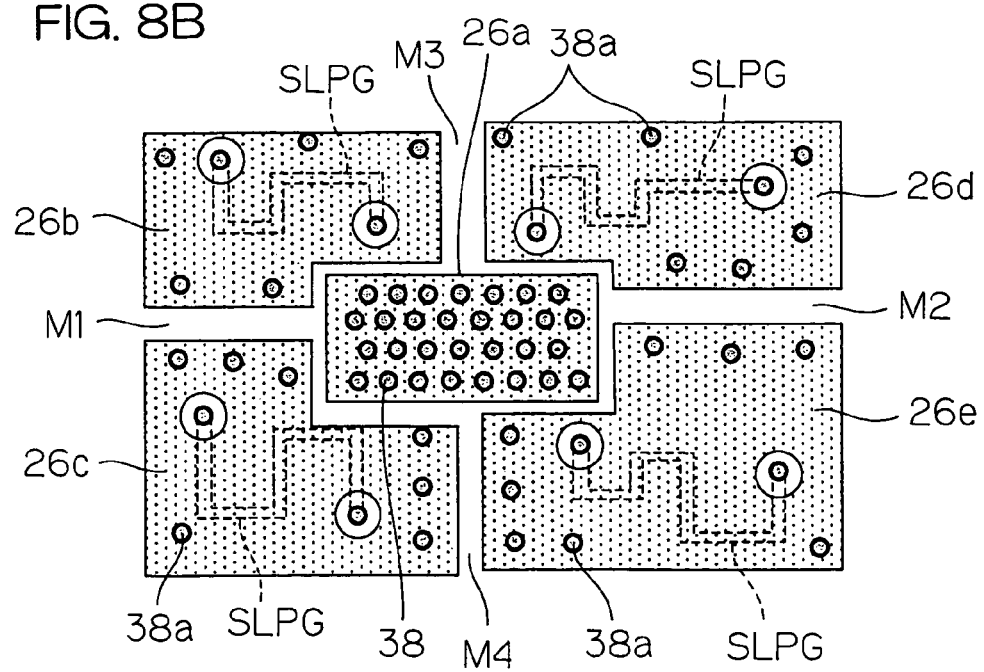
FIG. 8B is a view illustrating another interference preventing ground pattern in a high-frequency module of the present invention.

FIG. 8B shows another interference preventing ground patterns 26a to 26e in the high-frequency module of the present invention.

In the interference preventing ground patterns 26a to 26e, a high-frequency amplifying element ground and four voltage supply bias lines SLPG for supplying voltages to the high-frequency amplifying elements, are divided into five regions by division grooves M1~M4. The interference preventing ground patterns 26b to 26e have via-hole conductors 38a around the patterns or the division grooves. The via-hole conductors 38a are connected to the ground pattern 37 on the underside of the dielectric substrate A.

In the manner above-mentioned, the interference preventing ground patterns 26b to 26e are divided by regions in each of which a voltage supply bias line SLPG is formed. Accordingly, even though a harmonic signal generated at a high-frequency amplifying element, flows in the voltage supply bias line SLPG, the harmonic signal cannot be propagated because the interference preventing ground patterns 26b to 26e are separated from other interference preventing ground patterns 26b to 26e. Accordingly, the harmonic signal cannot be coupled to other voltage supply bias line SLPG, thus preventing the feedback of the harmonic signal. As a result, the harmonic signal level at the output terminal of the high-frequency module can be lowered to improve the harmonic characteristics of the high-frequency module.

According to the present invention, the slits or division grooves in the interference preventing ground pattern 26, are required to have such a width as to perfectly block the mutual electromagnetic coupling. For example, when the frequency is not less than 0.8 GHz, the width preferably has not less than 0.1 mm.

FIG. 9 is a bottom view illustrating a terminal pattern such as a ground terminal pattern formed on the underside of the multi-layer substrate A.

A ground terminal pattern is formed on the underside of the multi-layer substrate A, surrounded by a dashed line. A most portion of the ground terminal pattern is coated with an overcoat layer 39 as shown by a coarse hatching line. Portions not coated with the overcoat layer 39 are exposed, as shown with numerals 34, 36, and 37 in FIG. 9. The exposed portions are shown by a fine hatching line.

Formed at the periphery of the underside of the multi-layer substrate A are signal terminal patterns 32 for connection with an external circuit, and bias supply terminal patterns 33. Further, end-face through-hole electrodes 35 are formed, as extending from the top to the bottom, at the four corners of the multi-layer substrate A, and connected to ground terminal patterns 36 exposed at the four corner of the lowermost layer of the multi-layer substrate A.

At the center, two ground terminal patterns 37 having an LGA structure are exposed. In FIG. 9, two upper and lower ground terminal patterns 37 are exposed, but a single ground pattern in a unitary structure may also be exposed.

When the high-frequency module of the present invention is mounted, for example, on the printed circuit board of a mobile terminal, the ground terminal patterns are connected to the circuit of this printed circuit board.

To accelerate the heat conduction, the ground terminal patterns are connected to the thermal via-hole conductors 38 in FIG. 6. When the ground terminal patterns are connected to the thermal via-hole conductors 38 in the manner above-mentioned, the heat generated at the AMP-IC element 23a is conducted to the printed circuit board through the thermal via-hole conductors 38 and the ground patterns. This prevents changes and/or deterioration in output level and power added efficiency due to heat conduction from the AMP-IC element 23a A low thermal-resistance conductor such as silver or copper is used as the material of the thermal via-hole conductors 38. This prevents deterioration in output level and power added efficiency due to heat from the AMP-IC element 23a.

The LGA-structure ground patterns formed at the center of the underside of the multi-layer substrate, are large to such an extent as not to come in contact with the signal terminal patterns 32 formed at the periphery of the underside for external connection and with the bias supply terminal patterns 33. However, when the ground patterns are large, the soldering prints for connection with the printed circuit board become uneven. This involves the likelihood that the connection of the ground patterns 37 with the printed circuit board is defective. Accordingly, as described above, the overcoat layer 39 is applied to the portion, surrounded by a coarse hatching line in FIG. 9. Thus, portions of the ground terminal patterns 34, 36, and 37 are exposed as shown by a fine hatching line. The overcoat layer 39 is formed by an insulator with the same material of the substrate or synthetic resin such as glass or epoxy resin.

Each of FIG. 10A to FIG. 10E is a view illustrating another example of the pattern on the underside of the multi-layer substrate A.

In each of FIG. 10A to FIG. 10D, an LGA-structure ground pattern 37 is disposed at the center of the underside of the multi-layer substrate A. Disposed around the ground pattern 37 are terminal patterns for signal terminal patterns, bias supply terminal patterns and ground terminal patterns which are disposed at the inner and outer peripheries in a double manner. The ground terminal patterns 34 are shown by hatched squares, while the signal terminal patterns and the bias supply terminal patterns are shown by blank squares.

Figure 10A:
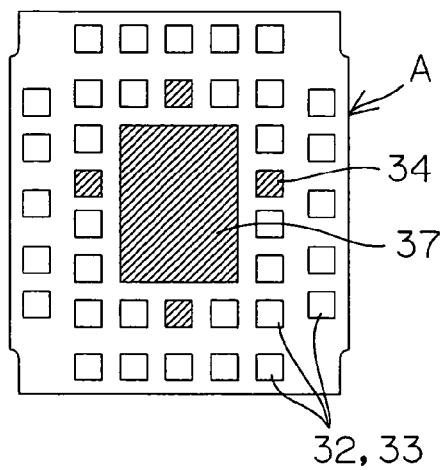

In FIG. 10A, the ground terminal patterns 34 are allocated to terminals disposed at the inner periphery. The signal terminal patterns and the bias supply terminal patterns can be allocated to other inner terminals than the terminals for the ground terminal patterns 34, and to the outer terminals. The arrangement of such a double peripheral terminal pattern can respond to the increase in the number of terminals in a multi-band module.

Figure 10B:
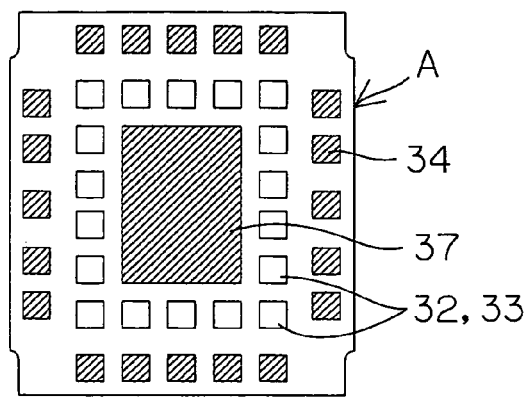

In FIG. 10B, the ground terminal patterns 34 are allocated to the terminals disposed at the outer periphery. The signal terminal patterns and the bias supply terminal patterns are allocated to the terminals disposed at the inner periphery. When the outer periphery is surrounded by the ground terminal patterns 34 in the manner above-mentioned, this prevents the interference from the outside circuit.

Figure 10C:
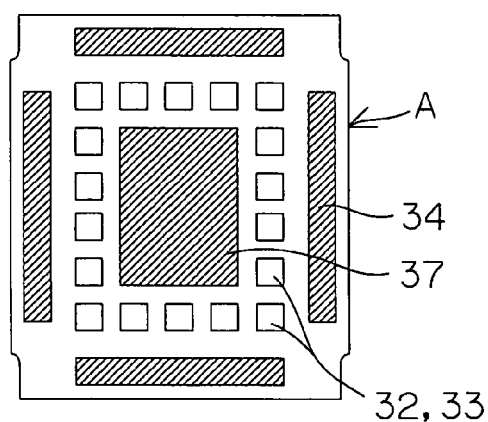

In FIG. 10C, a single continuous terminal in which outer-periphery terminals are being connected to one another, is formed at each side. Each continuous terminal serves as a ground pattern 34. The signal terminal patterns and the bias supply terminal patterns are allocated to the terminals disposed at the inner periphery. When the outer periphery is thus surrounded by the ground terminal patterns 34, this prevents the interference from the outside circuit.

Figure 10E:
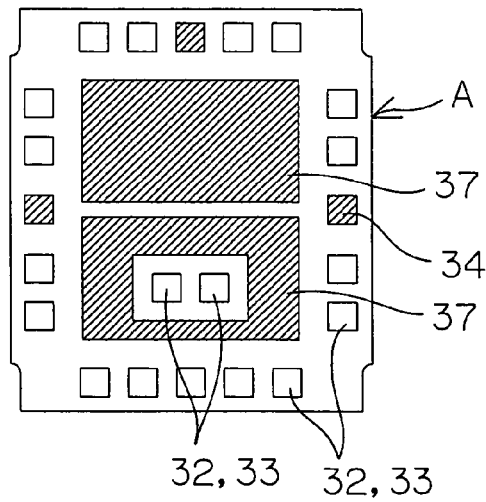
Figure 10D:
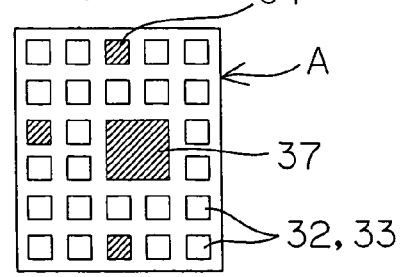

In FIG. 10D, the module is made smaller. Accordingly, the ground terminal pattern 37 at the center of the underside of the multi-layer substrate A, is also made small. Around the ground pattern 37, terminal patterns are disposed at the inner and outer peripheries in a double manner. Such a double arrangement can respond to the increase in the number of terminals even though the module is made small.

In FIG. 10E, a signal terminal pattern 32 and a bias supply terminal pattern 33 are formed inside of a ground pattern 37 at the center of the underside of the multi-layer substrate A. According to this arrangement, the signal terminal pattern 32 and the bias supply terminal pattern 33 are surrounded by the ground terminal patterns 34. This prevents the interference from the outside circuit.

In each of FIG. 10A to FIG. 10E, predetermined terminals may be coated with an overcoat glass so that at least a part of the terminals expose.

The following description will discuss a modification of the voltage supply bias lines for supplying power voltages to the high-frequency amplifying elements of the first, intermediate and last stages of the power amplifiers AMP110, AMP120.

FIG. 11 shows a circuit in which there are disposed (i) bias lines SLPG4, SLPG5, SLPG6 forming voltage supply bias lines of a last-stage high-frequency amplifying element MMIC11, an intermediate-stage high-frequency amplifying element MMIC12 and a first-stage high-frequency amplifying element MMIC13 of the power amplifier AMP110, and (ii) bias lines SLPD4, SLPD5, SLPD6 forming voltage supply bias lines of a last-stage high-frequency amplifying element MMIC21, an intermediate-stage high-frequency amplifying element MMIC22 and a first-stage high-frequency amplifying element MMIC23 of the power amplifier AMP120. In the circuit in FIG. 12, capacitors are connected at the power voltage sides and inductor elements are connected in series to the capacitors.

Each of the six bias lines has the same arrangement. Accordingly, the following description will discuss only one bias line SLPG4, and the description of other bias lines is omitted.

FIG. 11 shows a direct-current voltage supply terminal $V_{pg}$ for supplying a direct-current voltage to the last-stage high-frequency amplifying element MMIC11 in the power amplifier AMP110. The power terminal $V_{pg}$ is connected to the output side of the last-stage high-frequency amplifying element MMIC11 through the bias line SLPG4. A capacitor CPG4 is connected to the bias line SLPG4. Provision is made such that the capacitor CPG4 and the bias line SLPG4 are resonated to prevent a high-frequency signal from the last-stage high-frequency amplifying element MMIC11, from flowing into the direct-current voltage supply terminal $V_{pg}$.

An inductor LPG4 is connected between the capacitor CPG4 and the ground. The capacitor CPG4 and the inductor LPG4 are connected to the bias line SLPG4. It is therefore possible to adjust the impedance at the output side of the last-stage high-frequency amplifying element MMIC11. Accordingly, the matching with the matching circuit MAT10 as the next-stage circuit can be optimized.

When the high-frequency circuit is formed on the surface or inside of a multi-layer dielectric substrate, chip capacitors can be used as the capacitors CPG4, CPD4 and the like connected to the voltage supply bias lines. These chip capacitors can be mounted on the substrate surface or formed by a pair of electrodes which sandwich a dielectric layer of the multi-layer substrate therebetween.

Further, chip inductors can be used for the inductors LPG4, LPD4 and the like as dielectric elements connected between the capacitors and the grounds. However, these inductors can also be realized by conductor patterns formed on the surface or inside of the dielectric multi-layer substrate, or by via-hole conductors for connecting the conductor patterns.

Referring to FIG. 12, the following description will discuss a specific example of a circuit comprising capacitors and inductors connected to the voltage supply bias lines, with an intermediate-stage high-frequency amplifying element MMIC12 taken as an example. Other amplifiers are similar in wiring to the intermediate-stage high-frequency amplifying element MMIC12. Accordingly, only the wiring of the intermediate-stage high-frequency amplifying element MMIC12 will be discussed and the description of other amplifiers will therefore be omitted.

FIG. 12 is a schematic section view of a high-frequency module.

In FIG. 12, a high-frequency module comprises a laminated body having a plurality of dielectric layers 11~17. This laminated body is provided in the surface thereof with a concaved portion. An AMP-IC element 112 integrated by high-frequency amplifying elements MMICs 11 to 13 and MMICs 21 to 23 is mounted on the bottom inside of the concaved portion.

Formed on the surface of a dielectric substrate A are voltage supply bias lines SLPG5, SLPG6. One end of the bias line SLPG5 is connected to the AMP-IC element 112 mounted in the substrate concaved portion through a via-hole conductor V1 formed as passing through the dielectric substrate, a wiring L1 formed inside of the dielectric substrate A, and a wire W1. Also, one end of the bias line SLPG6 is connected to the AMP-IC element 112 mounted in the substrate concaved portion through (i) a via-hole conductor V2 formed as passing through the dielectric substrate, (ii) a wiring L2 formed inside of the dielectric substrate A, and (iii) a wire W2.

The other end of the bias line SLPG5 formed on the surface of the dielectric substrate, is connected to a capacitor CPG5 as a chip element mounted on the substrate A.

The capacitor CPG5 is connected to a via-hole conductor V3 which passes through the inside of the dielectric substrate A as vertically extending up to the underside of the substrate A. The via-hole conductor V3 forms an inductor LPG5. The via-hole conductor V3 is connected to a grand pattern GND1 formed on the underside of the substrate A.

The other end of the bias line SLPG6 formed on the surface of the dielectric substrate, is connected, by a via-hole conductor V4, to a capacitor CPG6 formed by a conductor pattern inside of the dielectric substrate A. The capacitor CPG6 is connected to the grand pattern GND2 formed inside of the substrate. The ground pattern GND2 inside of the substrate is connected to a ground pattern GND3 on the underside of the dielectric substrate A through a via-hole conductor V6.

The inductances of the via-hole conductors V4, V5, V6 and the GND2 form the inductor LPG5.

Thus, inductors can be formed by via-hole conductors and conductor patterns formed inside of the substrate. This achieves the desired characteristics of the high-frequency module without the number of component elements increased.

The voltage supply bias lines are wholly or partially formed on the surface of the dielectric substrate A. Accordingly, the lengths of the bias lines can readily be changed, thus facilitating the adjustment of impedance.

Thus, according to the embodiment above-mentioned, inductors formed by via-hole conductors, conductor patterns and the like are interposed between the grounds and the capacitors connected to the voltage supply bias lines. This readily effectively adjusts and improves the output power characteristics for the output control voltage of the amplifiers.

FIG. 14 is a graph illustrating changes in output power characteristics with respect to the output control voltage of the amplifiers according to the present invention. FIG. 15 is a graph illustrating changes in output power characteristics with respect to the output control voltage of amplifiers of prior art. According to the present invention, the relationship between the output power and the output control voltage can be linearly controlled as shown in FIG. 14.

According to the present invention, instead of the inductor LPG4, LPG5, LPG6, LPD4, LPD5, LPD6 formed in the high-frequency module as shown in FIG. 11, low-capacity capacitors CPG4, CPG5, CPG6, CPD4, CPD5, CPD6 may be disposed between the grounds and the voltage supply bias lines SLPG4 SLPG6, SLPD4 SLPD6 connected to high-frequency amplifying elements as shown in the circuit diagram in FIG. 13. Such an arrangement also produces similar effects. In particular, the capacity of these capacitors is preferably not greater than 100 pF, and more preferably not greater than 70 pF.

When low-capacity capacitors are used, a fine adjustment can be made by generating inductor components at the via-hole conductors V3, V4, V5, V6 and the ground GND2 in FIG. 12. Accordingly, the relationship between the output power and the output control voltage can be linearly controlled as shown in the graph in FIG. 14.

The present invention should not be limited to the embodiments above-mentioned, but various modifications can be made within the scope of the present invention.

What we claim is:

1. A high-frequency module comprising:
    a multi-layer substrate of a plurality of laminated dielectric layers;
    an antenna terminal;
    a diplexer connected to the antenna terminal for branching a plurality of transmission/reception systems different in pass band from one another;
    switch circuits connected to the diplexer for switching the transmission/reception systems to transmission systems and reception systems;
    power amplifiers connected to the switch circuits for amplifying transmission signals in the pass bands of the transmission systems; and
    matching circuits for matching the impedances of the power amplifiers to one another,
    the power amplifiers and the switch circuits respectively being formed by high-frequency semiconductor integrated circuit elements, and
    these high-frequency semiconductor integrated circuit elements being mounted on the surface of the multi-layer substrate.

2. A high-frequency module according to claim 1, wherein directional couplers for taking out monitor signals from transmission signals of the transmission systems, are disposed between the switch circuits and the power amplifiers.

3. A high-frequency module according to claim 2, further comprising an automatic power control circuit connected to the directional couplers for supplying, to the power amplifiers, control signals corresponding to the monitor signals taken out from the directional couplers.

4. A high-frequency module according to claim 3, wherein the automatic power control circuit is formed by a high-frequency semiconductor integrated circuit element, and this high-frequency semiconductor integrated circuit element is mounted on the surface of the multi-layer substrate.

5. A high-frequency module according to claim 1, further comprising a current detecting circuit for detecting the amounts of electric currents in the power amplifiers, and an automatic power control circuit for controlling the powers of the power amplifiers based on the current amounts detected by the current detecting circuit.

6. A high-frequency module according to claim 5, wherein the automatic power control circuit is formed by a high-frequency semiconductor integrated circuit element, and this high-frequency semiconductor integrated circuit element is mounted on the surface of the multi-layer substrate.

7. A high-frequency module according to claim 1, wherein a low-pass filter for attenuating a harmonic component of a transmission signal, is disposed at at least one position in the signal passages from the antenna terminal to the power amplifiers.

8. A high-frequency module according to claim 7, wherein at least one low-pass filter is disposed in the signal passages from the antenna terminal to the switch circuits.

9. A high-frequency module according to claim 1, wherein a high-pass filter or a band-pass filter for attenuating a transient high-voltage surge which entered the antenna terminal, is disposed in the passages from the antenna terminal to the switch circuits.

10. A high-frequency module according to claim 9, wherein the high-pass filter or the band-pass filter is disposed only in the passage of the transmission/reception system in the lowest frequency band.

11. A high-frequency module according to claim 1, wherein
    a die pad is formed on the surface of the multi-layer substrate,
    the high-frequency semiconductor integrated circuit elements forming the power amplifiers are mounted on the surface of the multi-layer substrate through the die pad, and
    the die pad is connected, through heat radiating via-hole conductors formed as passing through the multi-layer substrate, to a ground terminal pattern formed on the underside of the multi-layer substrate.

12. A high-frequency module according to claim 11, wherein
    a die pad is formed on the surface of the multi-layer substrate,
    the high-frequency semiconductor integrated circuit elements forming the switch circuits, are mounted on the surface of the multi-layer substrate through the die pad, and
    the die pad for the high-frequency semiconductor integrated circuit elements forming the power amplifiers, is not connected to the die pad for the high-frequency semiconductor integrated circuit elements forming the switch circuits by a conductor pattern formed on the surface or inside of the multi-layer substrate.

13. A high-frequency module according to claim 1, wherein distributed constant lines forming the matching circuits are formed between the portions where the directional couplers, the switch circuits or the diplexer are mounted, and the portions where the high-frequency semiconductor integrated circuit elements for the power amplifiers are mounted.

14. A high-frequency module according to claim 1, wherein an interference preventing pattern formed by a conductor layer is formed on the surface or inside of the multi-layer substrate, and the interference-preventing pattern is connected to the ground terminal pattern on the underside of the multi-layer substrate.

15. A high-frequency module according to claim 14, wherein the interference preventing pattern is disposed between the power amplifiers and any one of the directional couplers, the switch circuits, and the diplexer.

16. A high-frequency module according to claim 1, wherein the relative dielectric constant of the dielectric layers forming the multi-layer substrate, is not less than 4.

17. A high-frequency module according to claim 1, wherein the semiconductor integrated circuit elements for the switch circuits are made as a circuit pattern on a substrate of which chief ingredient is GaAs (gallium arsenide) compound.

18. A high-frequency module according to claim 1, wherein each of conductor layers formed on the dielectric layers forming the multi-layer substrate, is a conductor of which chief ingredient is selected from the group consisting of Ag (silver), Cu (copper), and Au (gold).

19. A high-frequency module according to claim 1, wherein
the multi-layer substrate incorporates (i) a plurality of voltage supply bias lines for supplying voltages to a plurality of high-frequency amplifying elements, and (ii) an interference preventing ground pattern,
the voltage supply bias lines are so disposed as not to overlap one another in plan elevation, and
slits are formed in the interference preventing ground pattern for separating the same into at least two regions in each of which a voltage supply bias line is being formed.

20. A high-frequency module according to claim 1, wherein
the multi-layer substrate incorporates (i) a plurality of voltage supply bias lines for supplying voltages to a plurality of high-frequency amplifying elements, and (ii) an interference preventing ground pattern,
the voltage supply bias lines are so disposed as not to overlap one another in plan elevation, and
division grooves are formed in the interference preventing ground pattern for separating the same into at least two regions in each of which a voltage supply bias line is being formed.

21. A high-frequency module according to claim 1, wherein
the multi-layer substrate is provided on the underside thereof with a ground terminal pattern, a bias terminal patterns, and signal terminal patterns for connecting the high-frequency module to an external circuit, and
the ground terminal pattern is disposed at the center of the underside of the multi-layer substrate.

22. A high-frequency module according to claim 21, wherein a plurality of terminal patterns for signal terminal patterns, bias supply terminal patterns and/or ground terminal patterns, are disposed, in a plurality of peripheral rows, around the ground terminal pattern disposed at the center of the underside of the multi-layer substrate.

23. A high-frequency module according to claim 22, wherein, out of the terminal patterns around the ground terminal pattern disposed at the center of the underside of the multi-layer substrate, the terminal patterns at the outermost peripheral row are allocated to ground terminal patterns.

24. A high-frequency module according to claim 21, wherein at least one of the signal terminal patterns and/or bias supply terminal patterns is formed inside of the ground terminal pattern disposed at the center of the underside of the multi-layer substrate.

25. A high-frequency module according to claim 21, wherein all or some of the signal terminal patterns, the ground terminal pattern or the bias terminal patterns on the underside of the multi-layer substrate is partly or wholly exposed, and the region which is not exposed is coated with an overcoat glass.

26. A high-frequency module according to claim 1, wherein
voltage supply bias lines are connected to the high-frequency amplifying elements forming the power amplifiers, and
capacitors are connected to the voltage supply bias lines, and inductors are connected between the capacitors and the grounds.

27. A high-frequency module according to claim 26, wherein the inductors connected to the capacitors are connected to ground conductors through via-hole conductors formed in the dielectric layers.

28. A high-frequency module according to claim 26, wherein the inductors connected to the capacitors are connected to ground conductors through via-hole conductors formed in the dielectric layers and conductor patterns formed in the dielectric layers.

29. A high-frequency module according to claim 26, wherein at least a portion of the voltage supply bias lines is formed on the surface of the dielectric multi-layer substrate, and capacitors connected to the voltage supply bias lines are mounted on the surface of the dielectric multi-layer substrate.

30. A high-frequency module according to claim 26, wherein the capacitors are formed by a pair of electrodes which sandwich dielectric layers of the multi-layer substrate therebetween.

31. A high-frequency module according to claim 1, wherein
voltage supply bias lines are connected to the high-frequency amplifying elements forming the power amplifiers, and
low-capacity capacitors are connected to the voltage supply bias lines.

32. A high-frequency module according to claim 31, wherein the capacitors have a capacity of not greater than 100 pF.

33. A high-frequency module according to claim 31, wherein at least a portion of the voltage supply bias lines is formed on the surface of the dielectric multi-layer substrate, and capacitors connected to the voltage supply bias lines are mounted on the surface of the dielectric multi-layer substrate.

34. A high-frequency module according to claim 31, wherein the capacitors are formed by a pair of electrodes which sandwich dielectric layers of the multi-layer substrate therebetween.

35. A radio communication apparatus on which the high-frequency module according to claim 1 is mounted.

* * * * *